United States Patent
Abe

(10) Patent No.: US 8,877,612 B2
(45) Date of Patent: *Nov. 4, 2014

(54) LASER PROCESSING METHOD
(75) Inventor: Yoshinori Abe, Ichihara (JP)
(73) Assignee: Toyoda Gosei Co., Ltd., Aichi (JP)
(*) Notice: Subject to any disclaimer, the term of this patent is extended or adjusted under 35 U.S.C. 154(b) by 0 days.

This patent is subject to a terminal disclaimer.

(21) Appl. No.: 13/643,424
(22) PCT Filed: Jun. 3, 2011
(86) PCT No.: PCT/JP2011/062826
§ 371 (c)(1), (2), (4) Date: Oct. 25, 2012
(87) PCT Pub. No.: WO2011/158672
PCT Pub. Date: Dec. 22, 2011

(65) Prior Publication Data
US 2013/0040466 A1 Feb. 14, 2013

(30) Foreign Application Priority Data

Jun. 16, 2010 (JP) ................... 2010-137546
Jun. 16, 2010 (JP) ................... 2010-137562
Jun. 16, 2010 (JP) ................... 2010-137568
Jun. 16, 2010 (JP) ................... 2010-137616

(51) Int. Cl.
H01L 21/00 (2006.01)
B23K 26/08 (2014.01)
B23K 26/40 (2014.01)
B23K 26/06 (2014.01)
B28D 5/00 (2006.01)
H01L 21/67 (2006.01)
B23K 26/00 (2014.01)
H01L 33/00 (2010.01)

(52) U.S. Cl.
CPC .......... B28D 5/0011 (2013.01); B23K 26/0823 (2013.01); B23K 26/4075 (2013.01); H01L 33/0095 (2013.01); B23K 2201/40 (2013.01); B23K 26/063 (2013.01); H01L 21/67092 (2013.01); B23K 26/0057 (2013.01); B23K 26/0853 (2013.01)
USPC ....................................... 438/463

(58) Field of Classification Search
CPC ........... H01L 2021/60112; H01L 2021/60292; H01L 2224/27552; H01L 2224/2763
USPC ........................................ 438/113, 460, 463
See application file for complete search history.

(56) References Cited

U.S. PATENT DOCUMENTS

| 7,470,566 B2 * | 12/2008 | Nakamura et al. ............. 438/113 |
| 2004/0002199 A1 | 1/2004 | Fukuyo et al. |
| 2006/0205183 A1 * | 9/2006 | Morikazu ...................... 438/463 |
| 2008/0003708 A1 | 1/2008 | Hoshino et al. |

FOREIGN PATENT DOCUMENTS

| CN | 1473087 A | 2/2004 |
| EP | 1 338 371 A1 | 8/2003 |

(Continued)

OTHER PUBLICATIONS

International Search report for PCT/JP2011/062826 dated Aug. 16, 2011.

Primary Examiner — Brook Kebede
(74) Attorney, Agent, or Firm — Sughrue Mion, PLLC

(57) ABSTRACT

In a modified region forming step, an element-group formation substrate (20) having plural semiconductor light emitting elements (21) formed on a substrate front surface (11a) of a wafer substrate (11) is irradiated with laser light (64) from the substrate back surface (11b) of the substrate, thereby forming the following inside the substrate: first and third modified regions (L1) and (L3) oriented in a y-direction (corresponding to a first direction) that is parallel to the surfaces of the substrate; and second and fourth modified regions (L2) and (L4) oriented in an x-direction (corresponding to a second direction) that is parallel to the surfaces of the substrate and differs from the y-direction. In the step, the first modified region (L1), the second modified region (L2), the third modified region (L3) and the fourth modified region (L4) are formed at different depths from the substrate back surface of the substrate.

19 Claims, 17 Drawing Sheets

(56) References Cited

FOREIGN PATENT DOCUMENTS

| JP | 2002-192371 A | 7/2002 |
| JP | 2003-266185 A | 9/2003 |
| JP | 2006-173520 A | 6/2006 |
| JP | 2006-245062 A | 9/2006 |
| JP | 2007-142114 A | 6/2007 |
| JP | 2007-317935 A | 12/2007 |
| JP | 2008-006492 A | 1/2008 |

* cited by examiner

FIG.9

| | SCANNING DIRECTION OF LASER LIGHT | OUTPUT OF LASER LIGHT | DEPTH OF MODIFIED REGION | INTERVAL BETWEEN ADJACENT MODIFIED PORTIONS | HEIGHT OF MODIFIED PORTION | GAP BETWEEN ADJACENT MODIFIED REGIONS |
|---|---|---|---|---|---|---|
| FIRST SCANNING (FIRST MODIFIED REGION L1) | Sc1 (y、-y) | P1 | D1 | I1 | H1 | |
| | | | | | | G12 |
| SECOND SCANNING (SECOND MODIFIED REGION L2) | Sc2 (x、-x) | P2 | D2 | I2 | H2 | |
| | | | | | | G23 |
| THIRD SCANNING (THIRD MODIFIED REGION L3) | Sc3 (y、-y) | P3 | D3 | I3 | H3 | |
| | | | | | | G34 |
| FOURTH SCANNING (FOURTH MODIFIED REGION L2) | Sc4 (x、-x) | P4 | D4 | I4 | H4 | |

FIG.14A

| NUMBER | FIRST MODIFIED REGION L1 | SECOND MODIFIED REGION L2 | THIRD MODIFIED REGION L3 | FOURTH MODIFIED REGION L4 |
|---|---|---|---|---|
| (1) | x | y | x | x |
| (2) | x | y | x | y |
| (3) | x | y | y | x |
| (4) | x | y | y | y |
| (5) | y | x | x | x |
| (6) | y | x | x | y |
| (7) | y | x | y | x |
| (8) | y | x | y | y |
| DEPTH | D1 | D2 | D3 | D4 |

FIG.14B

| NUMBER | FIRST MODIFIED REGION L1 | SECOND MODIFIED REGION L2 | THIRD MODIFIED REGION L3 |
|---|---|---|---|
| (1) | x | y | x |
| (2) | x | y | y |
| (3) | y | x | x |
| (4) | y | x | y |
| DEPTH | D1 | D2 | D3 |

FIG.14C

| NUMBER | FIRST MODIFIED REGION L1 | SECOND MODIFIED REGION L2 |
|---|---|---|
| (1) | x | y |
| (2) | y | x |
| DEPTH | D1 | D2 |

FIG.15A

| NUMBER | FIRST MODIFIED REGION L1 | SECOND MODIFIED REGION L2 | THIRD MODIFIED REGION L3 | FOURTH MODIFIED REGION L4 |
|---|---|---|---|---|
| (1) | x | x | x | y |
| (2) | x | x | y | x |
| (3) | x | x | y | y |
| (4) | x | y | x | x |
| (5) | x | y | x | y |
| (6) | x | y | y | x |
| (7) | x | y | y | y |
| (8) | y | x | x | x |
| (9) | y | x | x | y |
| (10) | y | x | y | x |
| (11) | y | x | y | y |
| (12) | y | y | x | x |
| (13) | y | y | x | y |
| (14) | y | y | y | x |
| DEPTH | D1 | D2 | D3 | D4 |

FIG.15B

| NUMBER | FIRST MODIFIED REGION L1 | SECOND MODIFIED REGION L2 | THIRD MODIFIED REGION L3 |
|---|---|---|---|
| (1) | x | x | y |
| (2) | x | y | x |
| (3) | x | y | y |
| (4) | y | x | x |
| (5) | y | x | y |
| (6) | y | y | x |
| DEPTH | D1 | D2 | D3 |

FIG.16A

| NUMBER | FIRST MODIFIED REGION L1 | SECOND MODIFIED REGION L2 | THIRD MODIFIED REGION L3 | FOURTH MODIFIED REGION L4 |
|---|---|---|---|---|
| (1) | x | x | x | y |
| (2) | x | x | y | x |
| (3) | x | x | y | y |
| (4) | x | y | x | x |
| (5) | x | y | x | y |
| (6) | x | y | y | x |
| (7) | x | y | y | y |
| (8) | y | x | x | x |
| (9) | y | x | x | y |
| (10) | y | x | y | x |
| (11) | y | x | y | y |
| (12) | y | y | x | x |
| (13) | y | y | x | y |
| (14) | y | y | y | x |
| DEPTH | D1 | D2 | D3 | D4 |

FIG.16B

| NUMBER | FIRST MODIFIED REGION L1 | SECOND MODIFIED REGION L2 | THIRD MODIFIED REGION L3 |
|---|---|---|---|
| (1) | x | x | y |
| (2) | x | y | x |
| (3) | x | y | y |
| (4) | y | x | x |
| (5) | y | x | y |
| (6) | y | y | x |
| DEPTH | D1 | D2 | D3 |

FIG.16C

| NUMBER | FIRST MODIFIED REGION L1 | SECOND MODIFIED REGION L2 |
|---|---|---|
| (1) | x | y |
| (2) | y | x |
| DEPTH | D1 | D2 |

FIG.17A

| NUMBER | FIRST MODIFIED REGION L1 | SECOND MODIFIED REGION L2 | THIRD MODIFIED REGION L3 | FOURTH MODIFIED REGION L4 |
|---|---|---|---|---|
| (1) | x | y | x | y |
| (2) | y | x | y | x |
| DEPTH | D1 | D2 | D3 | D4 |

FIG.17B

| NUMBER | FIRST MODIFIED REGION L1 | SECOND MODIFIED REGION L2 | THIRD MODIFIED REGION L3 |
|---|---|---|---|
| (1) | x | y | x |
| (2) | y | x | y |
| DEPTH | D1 | D2 | D3 |

LASER PROCESSING METHOD

CROSS REFERENCE TO RELATED APPLICATIONS

This application is a National Stage of International Application No. PCT/JP2011/062826 filed Jun. 3, 2011, claiming priority based on Japanese Patent Application Nos. 2010-137546, filed Jun. 16, 2010, 2010-137562 filed Jun. 16, 2010, 2010-137568 filed Jun. 16, 2010 and 2010-137616 filed Jun. 16, 2010, the contents of all of which are incorporated herein by reference in their entirety.

TECHNICAL FIELD

The present invention relates to a laser processing method for processing an element-group formation substrate, which is prepared by forming plural electronic elements on a substrate, into individual pieces (chips).

BACKGROUND ART

A method for obtaining plural element chips that divides an element-group formation substrate, in which plural electronic elements are formed on a substrate, into individual pieces is widely used.

As a conventional technique described in a gazette, there is a technique in which modified regions are formed inside a semiconductor substrate, such as a silicon wafer, by focusing laser light inside the semiconductor substrate and performing irradiation, to form a first expected cutting portion with the modified regions in a first direction, and other modified regions are formed inside the semiconductor substrate by focusing laser light inside the semiconductor substrate and performing irradiation to form a second expected cutting portion with the modified regions in a second direction that intersects the first direction (refer to Patent Document 1).

In addition, as another conventional technique described in a gazette, there exists a technique in which, in a production method that forms individual group III nitride-based compound semiconductor elements by dividing a sapphire substrate on which a group III nitride-based compound semiconductor is laminated, at least two stages of work modifying portions (break lines) are formed in a depth direction of the sapphire substrate by focusing pulse laser inside the sapphire substrate and on an expected dividing plane to divide into chips (refer to Patent Document 2).

CITATION LIST

Patent Literature

Patent Document 1: Japanese Patent Application Laid-Open Publication No. 2003-266185
Patent Document 2: Japanese Patent Application Laid-Open Publication No. 2006-245062

SUMMARY OF INVENTION

Technical Problem

However, when the second expected cutting portion was formed along the second direction inside the substrate, in which the first expected cutting portion had been formed along the first direction by irradiation with laser light, there were some cases where the electronic elements formed on the substrate were deteriorated by laser light to form the second expected cutting portion at a portion corresponding to an intersecting region of the first expected cutting portion and the second expected cutting portion.

The present invention has an object to suppress deterioration of the electronic elements formed on the substrate in the case where plural modified regions are formed by use of laser light in intersecting directions inside the substrate.

Solution to Problem

To achieve the above-described object, the present invention employed the following configuration.

According to a first aspect of the present invention, there is provided a laser processing method in which a modified region in a first direction being along a surface of a plate-shaped substrate and other modified region in a second direction being along the surface of the substrate and different from the first direction are formed inside the substrate by irradiating an element-group formation substrate, in which plural electronic elements are formed on a front surface of the substrate, with laser light from a back surface side of the substrate, the method including: forming the modified region and the other modified region with different depths from the back surface of the substrate.

According to a second aspect of the present invention, in the laser processing method of the first aspect, the modified region and the other modified region are formed on a side closer to the back surface than a center of a thickness direction from the front surface to the back surface of the substrate.

According to a third aspect of the present invention, in the laser processing method of the first aspect, the first direction is along a first arrangement direction of the plural electronic elements on the element-group formation substrate, and the second direction is along a second arrangement direction of the plural electronic elements on the element-group formation substrate.

According to a fourth aspect of the present invention, in the laser processing method of the first aspect, the substrate is composed of sapphire and the plural electronic elements include a group III nitride semiconductor layer.

According to a fifth aspect of the present invention, in the laser processing method of the first aspect, the modified region is formed at a portion where a depth thereof from the back surface of the substrate is a first depth, and thereafter, the other modified region is formed at a portion where a depth thereof from the back surface of the substrate is a second depth, which is shallower than the first depth.

According to a sixth aspect of the present invention, there is provided a laser processing method including: a step of forming a first modified region along a first direction inside a substrate by sequentially irradiating an element-group formation substrate, in which plural electronic elements are formed on a front surface of the substrate having a plate shape, with laser light in the first direction being along a surface of the substrate from a back surface side of the substrate and by sequentially focusing the laser light at a portion inside the substrate where a depth thereof from the back surface is a first depth; a step of forming a second modified region along a second direction inside the substrate by sequentially irradiating the element-group formation substrate, in which the first modified region has been formed, with laser light in the second direction being along a surface of the substrate from a back surface side of the substrate and by sequentially focusing the laser light at a portion inside the substrate where a depth thereof from the back surface is a second depth, which is different from the first depth; and a step of forming a third modified region along a third direction inside the substrate by sequentially irradiating the element-group formation substrate, in which the first modified region and the second modified region have been formed, with laser light in the third direction being along a surface of the substrate from a back surface side of the substrate and by sequentially focusing the laser light at a portion inside the substrate where a depth thereof from the back surface is a third depth, which is different from the first depth and the second depth, wherein, of the first modified region, the second modified region and the third modified region, two modified regions are formed along a same direction, and one other modified region is formed along a direction different from the same direction.

According to a seventh aspect of the present invention, in the laser processing method of the sixth aspect, the two modified regions along the same direction are formed to overlap in a thickness direction of the substrate.

According to an eighth aspect of the present invention, in the laser processing method of the sixth aspect, in the step of forming the second modified region, the second depth at which the second modified region is formed is made shallower than the first depth, and in the step of forming the third modified region, the third depth at which the third modified region is formed is made shallower than the second depth.

According to a ninth aspect of the present invention, the laser processing method of the sixth aspect further includes: a step of forming a fourth modified region along the different direction inside the substrate by sequentially irradiating the element-group formation substrate, in which the first modified region, the second modified region and the third modified region have been formed, with laser light in the different direction being along a surface of the substrate from a back surface side of the substrate and by sequentially focusing the laser light at a portion inside the substrate where a depth thereof from the back surface is a fourth depth, which is different from the first depth, the second depth and the third depth.

According to a tenth aspect of the present invention, the laser processing method of the sixth aspect further includes: a step of forming a fourth modified region along the same direction inside the substrate by sequentially irradiating the element-group formation substrate, in which the first modified region, the second modified region and the third modified region have been formed, with laser light in the same direction being along a surface of the substrate from a back surface side of the substrate and by sequentially focusing the laser light at a portion inside the substrate where a depth thereof from the back surface is a fourth depth, which is different from the first depth, the second depth and the third depth.

According to an eleventh aspect of the present invention, in the laser processing method of the sixth aspect, the substrate is composed of sapphire and the plural electronic elements include a group III nitride semiconductor layer.

According to a twelfth aspect of the present invention, in the laser processing method of the sixth aspect, the first direction and the third direction are assumed to be the same direction, and the second direction is assumed to be the different direction.

According to a thirteenth aspect of the present invention, in the laser processing method of the sixth aspect, the substrate constituting the element-group formation substrate has a structure that is hardly broken in the same direction than in the different direction.

According to a fourteenth aspect of the present invention, in the laser processing method of the sixth aspect, in a case where each of the plural electronic elements constituting the element-group formation substrate has a longer side and a shorter side, and arranged on the substrate in a state of aligning the longer side and the shorter side, the longer side is assumed to be the same direction and the shorter side is assumed to be the different direction.

According to a fifteenth aspect of the present invention, there is provided a laser processing method in which a modified region group constituted by three or more modified regions including a modified region in a first direction being along a surface of a plate-shaped substrate and other modified region in a second direction being along the surface of the substrate and different from the first direction is formed inside the substrate by irradiating an element-group formation substrate, in which plural electronic elements are formed on a front surface of the substrate, with laser light from a back surface side of the substrate, the method including: forming the modified region and the other modified region constituting the modified region group with different depths from the back surface of the substrate.

According to a sixteenth aspect of the present invention, in the laser processing method of the fifteenth aspect, the modified region and the other modified region constituting the modified region group are formed on a side closer to the back surface than a center of a thickness direction from the front surface to the back surface of the substrate.

According to a seventeenth aspect of the present invention, in the laser processing method of the fifteenth aspect, the first direction is along a first arrangement direction of the plural electronic elements on the element-group formation substrate, and the second direction is along a second arrangement direction of the plural electronic elements on the element-group formation substrate.

According to an eighteenth aspect of the present invention, in the laser processing method of the fifteenth aspect, the substrate is composed of sapphire and the plural electronic elements include a group III nitride semiconductor layer.

According to a nineteenth aspect of the present invention, in the laser processing method of the fifteenth aspect, the modified region and the other modified region constituting the modified region group are formed sequentially so that the first direction and the second direction alternately appear.

Advantageous Effects of Invention

According to the present invention, it is possible to suppress deterioration of the electronic elements formed on the substrate in the case where plural modified regions are formed by use of laser light in intersecting directions inside the substrate.

BRIEF DESCRIPTION OF DRAWINGS

FIG. 9 is a diagram indicating an example of conditions and results in each of a first scanning (first modified region) to a fourth scanning (fourth modified region) in the modified region forming step;

FIGS. 14A to 14C are diagrams showing lists of configuration examples of plural modified regions to which a first mode is applicable;

FIGS. 15A and 15B are diagrams showing lists of configuration examples of plural modified regions to which a second mode is applicable;

FIGS. 16A to 16C are diagrams showing lists of configuration examples of plural modified regions to which a third mode is applicable; and FIGS. 17A and 17B are diagrams showing lists of configuration examples of plural modified regions to which a fourth mode is applicable.

DESCRIPTION OF EMBODIMENTS

Figure 1:
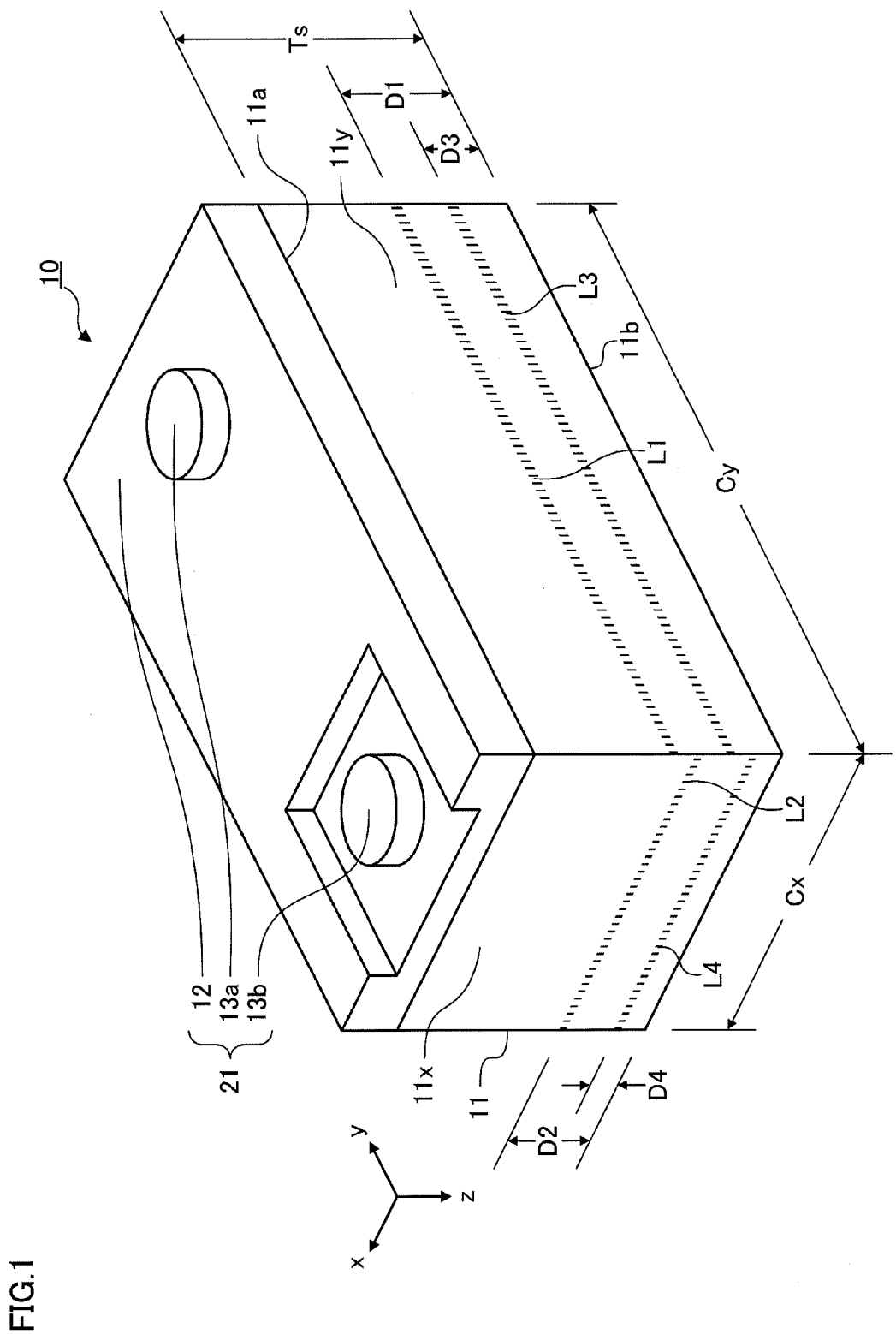
FIG. 1 is a perspective view showing an example of a configuration of an element chip obtained by using a production method in an exemplary embodiment.

Hereinafter, an exemplary embodiment according to the present invention will be described in detail with reference to accompanying drawings. It should be noted that, in the drawings used in the following description, a scale in each figure is not accurate because each component is schematically indicated.

FIG. 1 is a perspective view showing an example of a configuration of an element chip 10 obtained by using a production method (to be described in detail later) in the exemplary embodiment.

The element chip 10 shown in FIG. 1 is equipped with a semiconductor light emitting element 21 that emits, for example, blue light and has a shape of a rectangular parallelepiped, and includes: a substrate 11 having a substrate front surface 11a and a substrate back surface 11b that is on a back side of thereof; a laminated semiconductor layer 12 laminated on the substrate front surface 11a of the substrate 11; and two electrodes 13a and 13b formed on the laminated semiconductor layer 12. The semiconductor light emitting element 21 is configured with these laminated semiconductor layer 12, electrodes 13a and 13b.

In the exemplary embodiment, as the substrate 11, a sapphire single crystal is used, which is configured so that the substrate front surface 11a on which the laminated semiconductor layer 12 is laminated is a C-plane. However, the sapphire single crystal is not limited thereto, and those in which the substrate front surface 11a is slightly inclined from the C-plane, and further, the substrate front surface 11a is other plane may be used.

It should be noted that, other than sapphire, carbonized silicon (silicon-carbide), silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium oxide, tungstic oxide, molybdenum oxide, gallium nitride and the like can be used as the substrate 11.

In addition, in the case of configuring the semiconductor light emitting element 21 that emits blue light, the laminated semiconductor layer 12 can be configured by, for example, laminating plural group III nitride semiconductor layers. Then, it becomes possible to provide a so-called LED structure by sequentially laminating an n-type layer, a light emitting layer and a p-type layer (all of them are not shown), which are composed of a group III nitride semiconductor, on the laminated semiconductor layer 12. It should be noted that, in this case, an intermediate layer or a base layer (both not shown), which is composed of a group III nitride, can be formed between a to-be-laminated surface of the substrate 11 and an n-type semiconductor layer.

Further, the electrode 13a is formed on a p-type semiconductor layer side of the laminated semiconductor layer 12, and the electrode 13b is formed on an n-type semiconductor layer side of the laminated semiconductor layer 12. The element chip 10 is configured so that light is emitted from the light emitting layer by passing an electric current from the electrode 13a toward the electrode 13b through the p-type layer, the light emitting layer and the n-type layer that are not shown in the figure.

Moreover, since the element chip 10 of the exemplary embodiment has a shape of a rectangular parallelepiped, when the substrate front surface 11a is viewed from above, the surface has a long side direction and a short side direction. Accordingly, other than the substrate front surface 11a and the substrate back surface 11b, the substrate 11 has four substrate side surfaces. It should be noted that, in the following description, the short side direction of the element chip 10 is referred to as an x-direction, and the long side direction is referred to as a y-direction. Moreover, a direction that intersects the x-direction and the y-direction and heads from the laminated semiconductor layer 12 toward the substrate 11 in the element chip 10 is referred to as a z-direction.

Further, in the following description, two x-direction cross sections (xz cross sections) of the substrate 11 are referred to as substrate short side surfaces 11x, and two y-direction cross sections (yz cross sections) of the substrate 11 are referred to as substrate long side surfaces 11y. Here, the two substrate short side surfaces 11x face each other with the substrate 11 being interposed therebetween, and the two substrate long side surfaces 11y face each other with the substrate 11 being interposed therebetween. In FIG. 1, only one of the substrate short side surfaces 11x and only one of the substrate long side surfaces 11y adjacent thereto are shown. It should be noted that, in an actual element chip 10, there are some cases where the substrate short side surface 11x deviates from an xz-plane, and the substrate long side surface 11y deviates from a yz-plane.

In the exemplary embodiment, there are two lines along the x-direction in the substrate short side surface 11x of the substrate 11, and there are two lines along the y-direction in the substrate long side surface 11y of the substrate 11. Here, these four lines are formed by modifying the sapphire that constitutes the substrate 11 with irradiation of laser light to be described later. It should be noted that, in the following description, the line formed on a side closer to the laminated semiconductor layer 12 in the substrate long side surface 11y of the substrate 11 is referred to as a first modified region L1, and the line formed on a side farther from the laminated semiconductor layer 12 than the first modified region L1 (on a side closer to the substrate back surface 11b than the first modified region L1) is referred to as a third modified region L3. In addition, the line formed on a side closer to the laminated semiconductor layer 12 in the substrate short side surface 11x of the substrate 11 is referred to as a second modified region L2, and the line formed on a side farther from the laminated semiconductor layer 12 than the second modified region L2 (on a side closer to the substrate back surface 11b than the second modified region L2) is referred to as a fourth modified region L4.

Here, when attention is focused on positional relationship among the first modified region L1 to the fourth modified region L4, in the exemplary embodiment, the first modified region L1 (y-direction), the second modified region L2 (x-direction), the third modified region L3 (y-direction) and the fourth modified region L4 (x-direction) are positioned in order from the side nearest to the laminated semiconductor layer 12. It should be noted that, in the exemplary embodiment, the y-direction and the x-direction correspond to the first direction and the second direction, respectively. Moreover, if it is assumed that a distance from the substrate back surface 11b to the first modified region L1 in the z-direction is a first depth D1, a distance from the substrate back surface 11b to the second modified region L2 in the z-direction is a second depth D2, a distance from the substrate back surface 11b to the third modified region L3 in the z-direction is a third depth D3 and a distance from the substrate back surface 11b to the fourth modified region L4 in the z-direction is a fourth depth D4, these have a relation of D1>D2>D3>D4. In addition, if it is assumed that a thickness of the substrate 11 in the z-direction is a substrate thickness Ts, the substrate thickness Ts and the first depth D1 have a relation of D1<Ts/2. Consequently, each of the first modified region L1, the second modified region L2, the third modified region L3 and the fourth modified region L4 in the exemplary embodiment is positioned over the center of the thickness of the substrate 11 in the z-direction (substrate thickness Ts) as viewed from the substrate front surface 11a, on which the laminated semiconductor layer 12 is laminated, namely, on the side closer to the substrate back surface 11b.

It should be noted that, in the following description, the length of the element chip 10 in the x-direction is referred to as a shorter chip side Cx, and the length of the element chip 10 in the y-direction is referred to as a longer chip side Cy. In this specific example, the shorter chip side Cx is 300 μm, and the longer chip side Cy is 600 μm. However, the lengths are not limited thereto, and the size of each of the shorter chip side Cx and the longer chip side Cy may be appropriately redesigned, and further, the lengths may be Cx=Cy or Cx>Cy.

Moreover, each of the electrodes 13a and 13b has a cylindrical shape, and the diameter thereof is the order of 100 μm.

Figure 2:
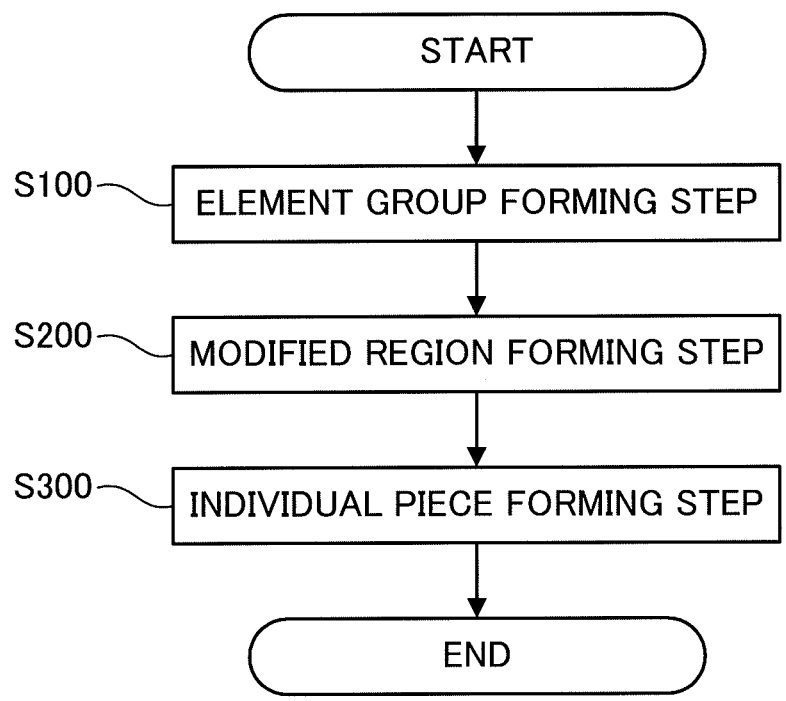
FIG. 2 is a flowchart indicating an example of the production method of the element chip.

FIG. 2 is a flowchart indicating an example of the production method of the element chip 10 shown in FIG. 1.

In this specific example, first, an element group forming step is performed (step 100) in which an element-group formation substrate 20 (refer to FIG. 3 to be descried later) is obtained by forming plural semiconductor light emitting elements 21 on the substrate 11 in a wafer shape composed of sapphire.

Next, with respect to the element-group formation substrate 20 obtained in step 100, a modified region forming step is performed (step 200) in which the above-described first modified region L1 to fourth modified region L4 are formed inside the wafer-shaped substrate 11.

Then, with respect to the element-group formation substrate 20 in which the first modified region L1 to the fourth modified region L4 are formed inside the wafer (substrate 11), an individual piece forming step is performed (step 300) in which the element chips 10 that are the individual pieces formed from the element-group formation substrate 20 are obtained by performing dividing started from the first modified region L1 to the fourth modified region L4.

Figure 3A:
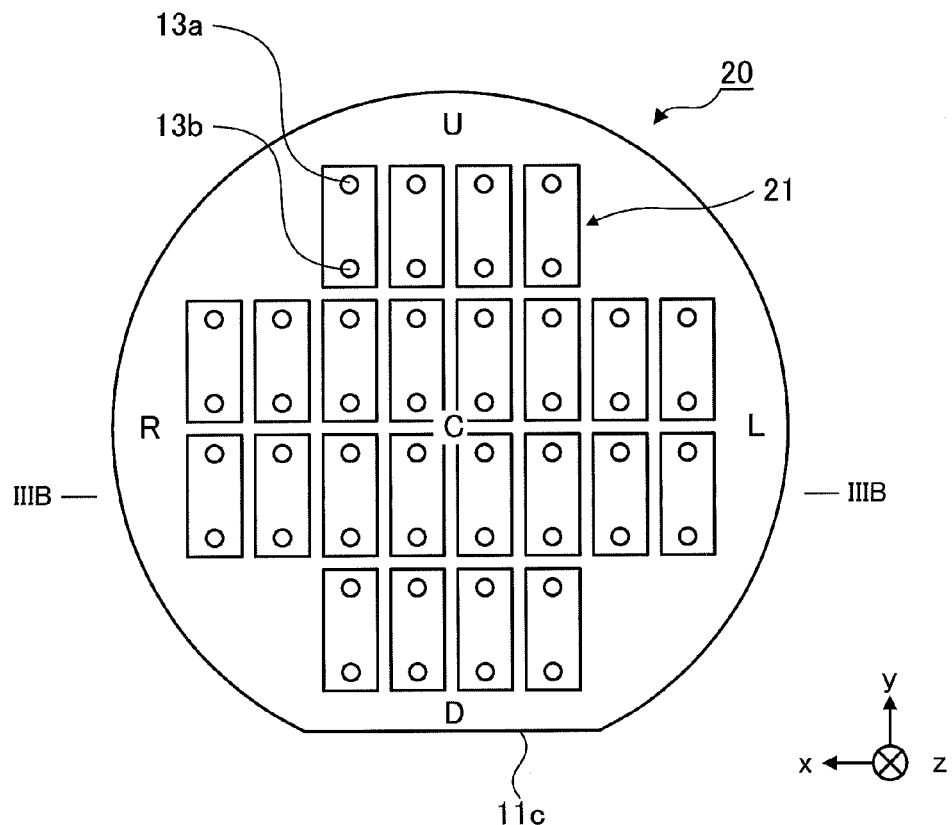
FIGS. 3A and 3B are diagrams showing an example of a basic configuration of an element-group formation substrate obtained by conducting an element-group forming step.
Figure 3B:
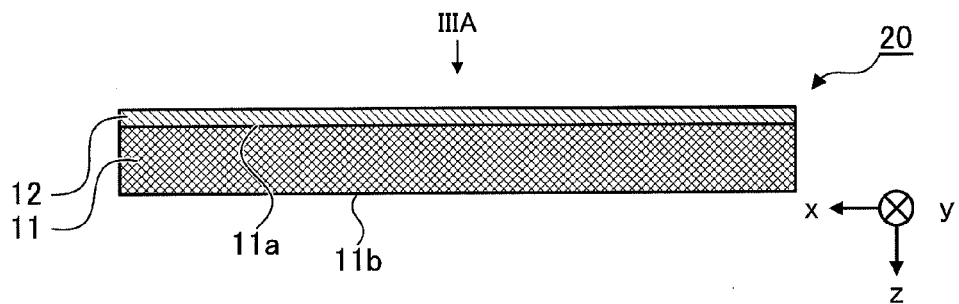

FIGS. 3A and 3B are diagrams showing an example of a configuration of the element-group formation substrate 20 obtained by performing the element-group forming step of step 100 as described above. Here, FIG. 3A is a top view of the element-group formation substrate 20 as viewed from a side facing a plane on which the plural semiconductor light emitting elements 21 are formed, and FIG. 3B is a IIIB-IIIB cross-sectional view of FIG. 3A. It should be noted that FIG. 3A corresponds to FIG. 3B as viewed from the IIIA direction.

The element-group formation substrate 20 includes: the substrate 11 in a wafer shape; the laminated semiconductor layer 12 laminated almost over the entire substrate front surface 11a of the substrate 11; and the plural electrodes 13a and 13b formed on the laminated semiconductor layer 12. As a result, the plural semiconductor light emitting elements 21 as an example of plural electronic elements are formed in a matrix shape on the substrate front surface 11a of the substrate 11.

In this specific example, a C-axis-oriented single crystal sapphire can be used as the wafer-shaped substrate 11, in which, for example, the diameter thereof is 4 inches (about 100 mm), and the thickness thereof is 50 μm to 250 μm. Moreover, on one end of the wafer-shaped substrate 11, an orientation flat (OF) 11c that indicates crystal orientation of the substrate 11 and becomes a standard in the process of forming the plural semiconductor light emitting elements 21 on the substrate 11 is provided. In this specific example, the OF 11c is formed along the [11-20] plane of the sapphire single crystal.

In this specific example, the plural semiconductor light emitting elements 21 are formed in horizontal and vertical alignments on the substrate 11 so that the x-direction on the substrate 11 is along the OF 11c and the y-direction on the substrate 11 intersects the OF 11c. Consequently, each of the plural semiconductor light emitting elements 21 is formed so that the short side direction thereof is along the same line with the OF 11c of the substrate 11 and the long side direction thereof is along the direction perpendicular to the OF 11c of the substrate 11. It should be noted that, in the following, with respect to the element-group formation substrate 20, the direction along the OF 11c is also referred to as the x-direction and the direction perpendicular to the OF 11c is also referred to as the y-direction. It should be noted that, in this specific example, the plural semiconductor light emitting elements 21 are aligned on the substrate 11 so that the short side direction of each thereof is along the x-direction (second alignment direction) and the long side direction of each thereof is along the y-direction (first alignment direction).

In addition, as shown in FIG. 3A, when the element-group formation substrate 20 is viewed from the laminated semiconductor layer 12 side, an end thereof on which the OF 11c is provided is referred to as a D-end portion, an end thereof opposite to the OF 11c is referred to as a U-end portion, an end thereof located on a right side when the OF 11c is located on a downside is referred to as an L-end portion, an end thereof located on a left side at this time is referred to as an R-end portion, and a center portion is referred to as a C-portion. It should be noted that, to be described later, in the modified region forming step of step 200, since laser light irradiation is performed from the substrate back surface 11b side, the R-end portion was located on the left side in the figure, the L-end portion was located on the right side in the figure, and a forward direction of the x-direction was headed from the L-end portion side to the R-end portion side.

Figure 4A:
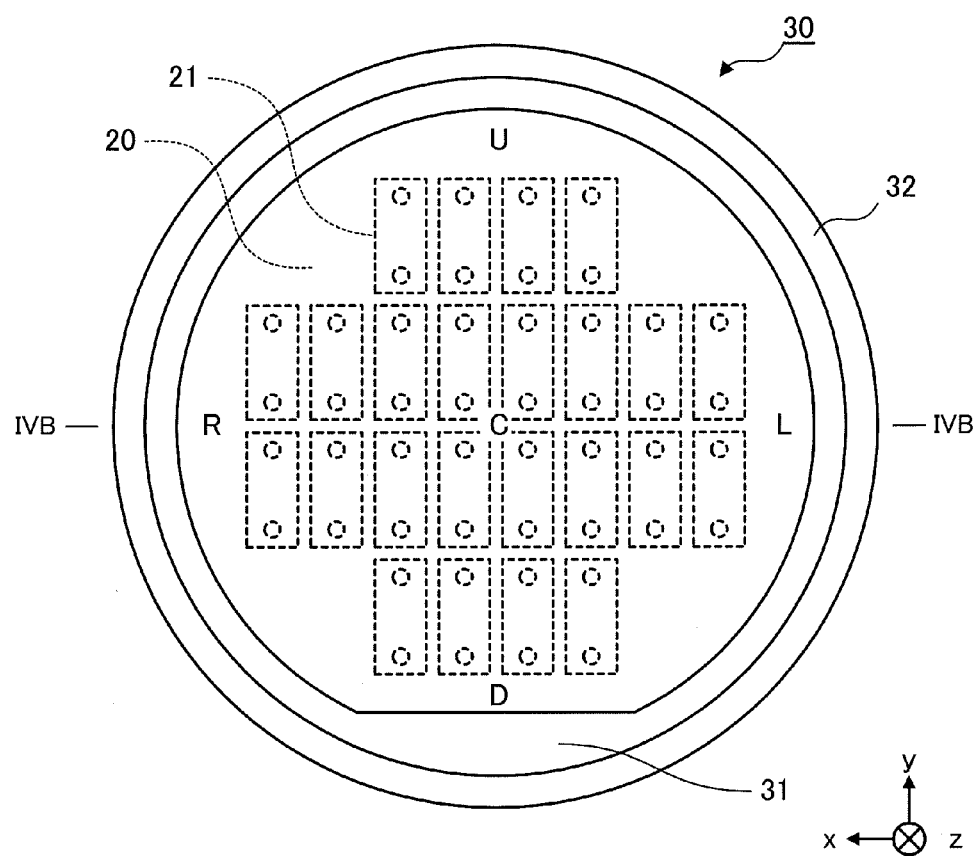
FIGS. 4A and 4B are diagrams showing an example of a configuration of a substrate unit used in a state where the element-group formation substrate is attached onto the substrate unit in a modified region forming step and an individual piece forming step.
Figure 4B:
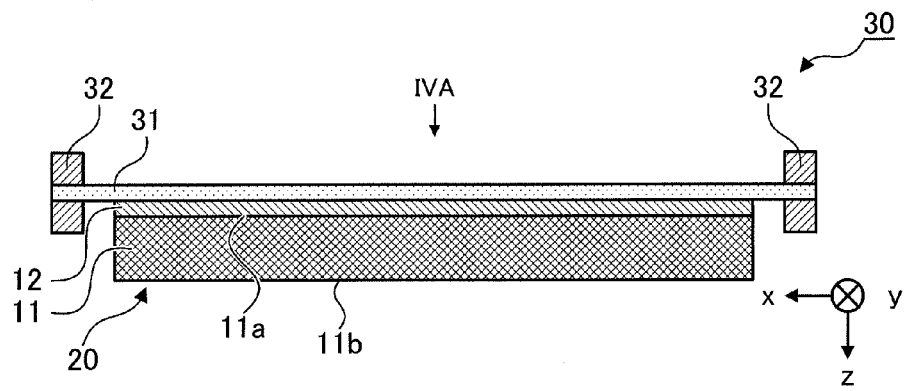

FIGS. 4A and 4B are diagrams showing an example of a configuration of a substrate unit 30 used in a state the element-group formation substrate 20 is attached onto the substrate unit 30 in the modified region forming step of step 200 and the individual piece forming step of step 300. Here, FIG. 4A is a top view of the substrate unit 30 as viewed from a side that faces a plane of the element-group formation substrate 20 on which the plural semiconductor light emitting elements 21 are formed, and FIG. 4B is a IVB-IVB cross-sectional view of FIG. 4A. it should be noted that FIG. 4A corresponds to FIG. 4B as viewed from the IVA direction.

The substrate unit 30 has an outer appearance of a cylindrical shape, and includes: an adhesive sheet 31 for attaching the laminated semiconductor layer 12 side (the side of the surface on which the plural semiconductor light emitting elements 21 are formed) of the element-group formation substrate 20 obtained in step 100; and a metal ring 32 that holds and supports the adhesive sheet 31 onto which the element-group formation substrate 20 is attached. Here, the metal ring 32 has an inner diameter that is larger than the element-group formation substrate 20, and the element-group formation substrate 20 is attached to the adhesive sheet 31 inside the metal ring 32 not to contact the metal ring 32. It should be noted that FIG. 4A shows a state in which the element-group formation substrate 20 is attached to the backside of the adhesive sheet 31 and is viewed through the adhesive sheet 31. In this manner, the element-group formation substrate 20 is attached to the substrate unit 30, and thereby, in the substrate unit 30, the substrate back surface 11b of the substrate 11 in the element-group formation substrate 20 is in the state of being exposed to the outside.

The adhesive sheet 31 constituting the substrate unit 30 is provided to hold the element-group formation substrate 20 and prevent the element chips 10 (refer to FIG. 1) obtained from the element-group formation substrate 20 from scattering in the modified region forming step of step 200 and the individual piece forming step of step 300.

Here, as the adhesive sheet 31, for example, a base material composed of various kinds of resin materials onto which a material having adhesiveness is attached can be used. In the exemplary embodiment, as the base material of the adhesive sheet 31, polyethylene terephthalate (PET) having high stiffness is used.

Figure 5:
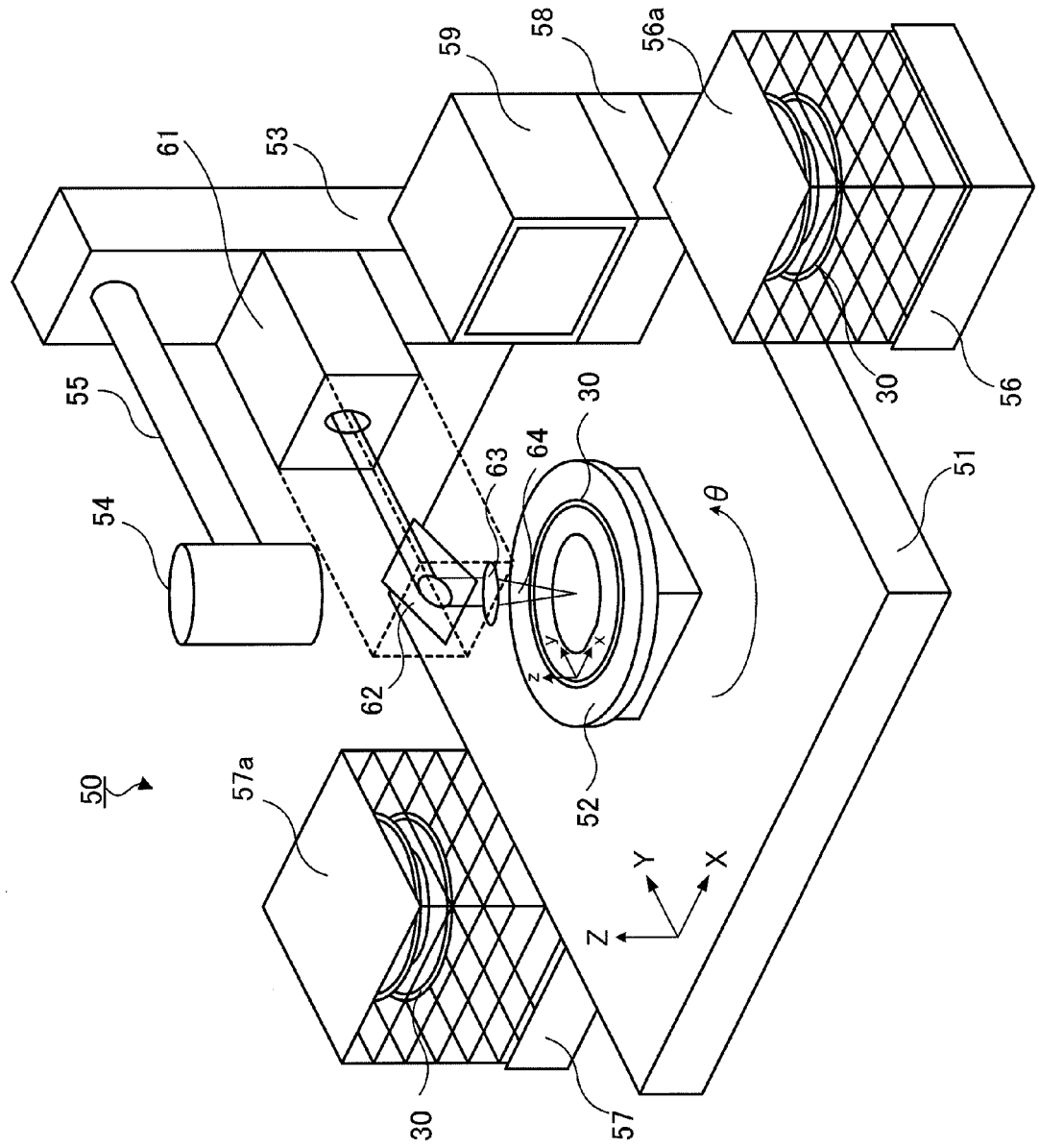
FIG. 5 is a perspective view showing an example of a configuration of a laser processing device used in the modified region forming step.

FIG. 5 is a perspective view showing an example of a configuration of a laser processing device 50 used in the modified region forming step of step 200.

The laser processing device 50 includes: a base body 51 to be placed on a table or the like; and an adsorptive stage 52 that is provided on the base body 51 and movable in the lateral direction (in the following description, referred to as an X-direction), to-and-fro direction (in the following description, referred to as a Y-direction), and vertical direction (in the following description, referred to as a Z-direction), and further in the rotational direction (in the following description, referred to as a θ-direction). It should be noted that, in the base body 51, a motor (not shown) for moving the adsorptive stage 52 in the X-, Y-, and Z-directions and a motor (not shown) for rotating the adsorptive stage 52 in the θ-direction are embedded.

The adsorptive stage 52 provided to the laser processing device 50 fixes the substrate unit 30 shown in FIG. 4 by vacuum adsorption. In this specific example, the substrate unit 30 is mounted on the adsorptive stage 52 so that the x-direction of the element-group formation substrate 20 coincides with the X-direction of the base body 51 and the y-direction of the element-group formation substrate 20 coincides with the Y-direction of the base body 51. At this time, the element-group formation substrate 20 is placed on the adsorptive stage 52 with the OF 11c of the substrate 11 being located at the front side thereof (−Y-direction side). As a result, when the substrate unit 30 is adsorbed by the adsorptive stage 52, in the element-group formation substrate 20 attached to the substrate unit 30, the substrate back surface 11b (z-direction side, refer to FIG. 4B) of the substrate 11 thereof is configured to face upwardly, namely, toward the Z-direction side.

Moreover, the laser processing device 50 includes a support body 53 that is provided on the base body 51 and supports a laser light generating unit 61 for generating laser light 64 heading for the −Y-direction. It should be noted that, in FIG. 5, a part of the laser light generating unit 61 is indicated by broken lines to show an internal structure thereof. The laser light generating unit 61 is configured to generate pulse-oscillated YAG (yttrium aluminum garnet) laser. In the laser light generation unit 61, there are provided: a dichroic mirror 62 to reflect the laser light 64 that proceeds toward the −Y-direction and deflect thereof in the −Z-direction toward the adsorptive stage 52 side; and an optical system 63 to gather the laser light 64 reflected by the dichroic mirror 62 and focus the light inside the substrate 11 (refer to FIG. 2) of the element-group formation substrate 20 mounted on the adsorptive stage 52.

Further, the laser processing device 50 includes an image pickup unit 54 that is arranged above the dichroic mirror 62 for observing the element-group formation substrate 20 mounted on the adsorptive stage 52 through the dichroic mirror 62. The image pickup unit 54 is attached to an arm 55 extending from the support body 53.

Still further, the laser processing device 50 also includes: a load cassette elevator 56 that accommodates the substrate unit 30 before being subjected to laser processing; and an unload cassette elevator 57 that accommodates the substrate unit 30 after being subjected to laser processing. Here, the load cassette elevator 56 is configured to be capable of accommodating plural load cassettes 56a that individually contain the substrate units 30 before being subjected to laser processing. On the other hand, the unload cassette elevator 57 is configured to be capable of accommodating plural unload cassettes 57a that individually contain the substrate units 30 after being subjected to laser processing. The substrate unit 30 before being subjected to laser processing, which is accommodated by the load cassette 56a, is configured to be moved to the adsorptive stage 52 by a not-shown robot arm, to be set. The substrate unit 30 after being subjected to laser processing is configured to be moved from the adsorptive stage 52 by the not-shown robot arm, to be accommodated by the unload cassette 57a.

The laser processing device 50 further includes: a controlling unit 58 that controls operations of the adsorptive stage 52, the load cassette elevator 56, the unload cassette elevator 57, the laser light generation unit 61 and the like; and a display unit 59 for displaying an image of the element-group formation substrate 20 taken by the image pickup unit 54, controlling information from the controlling unit 58 or the like.

Then, the above-described modified region forming step of step 200 will be described more specifically.

Figure 6:
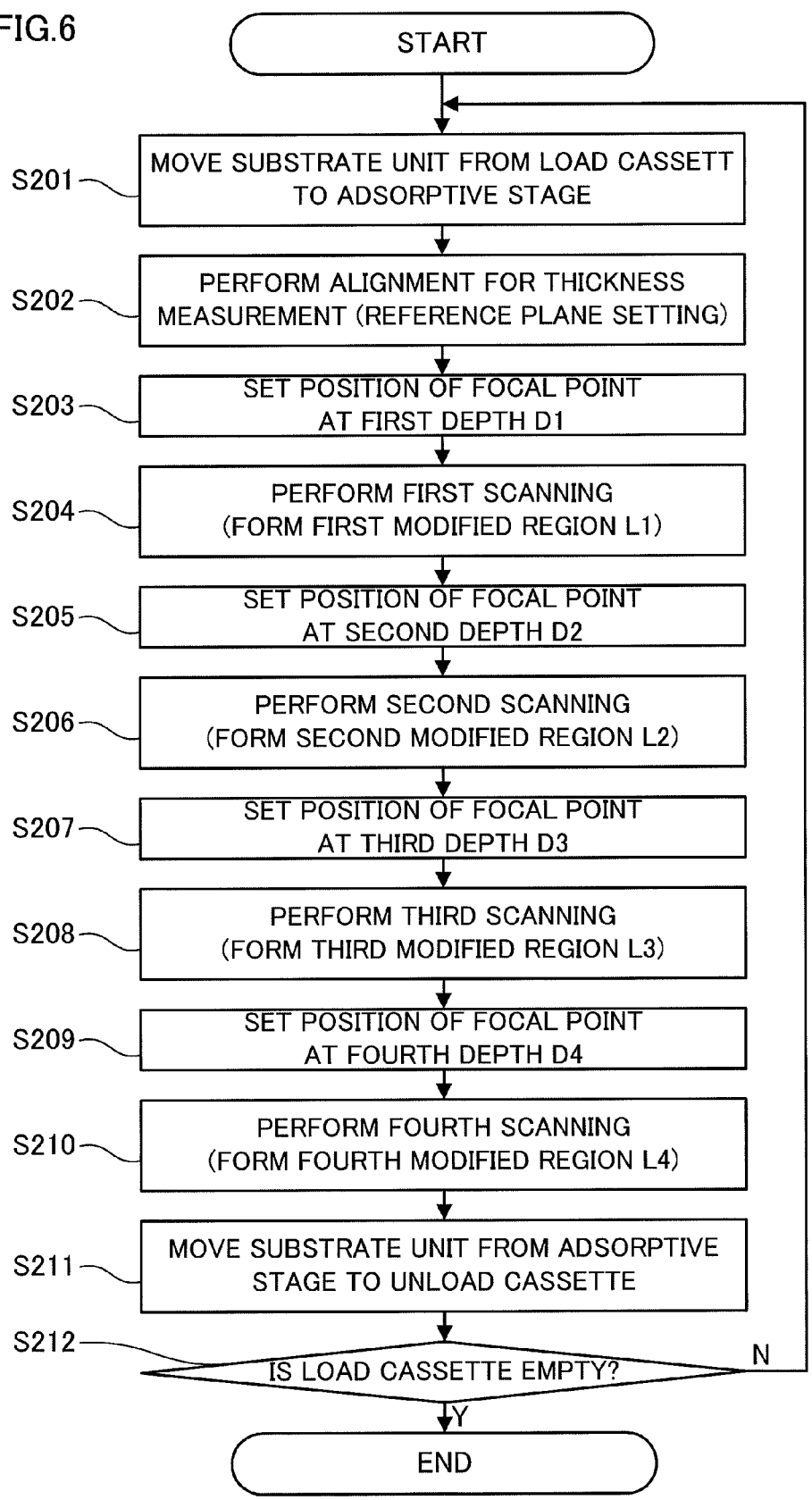
FIG. 6 is a flowchart indicating an example of processing procedures in performing the modified region forming step by use of the laser processing device.

FIG. 6 is a flowchart indicating an example of processing procedures in performing the modified region forming step of step 200 by use of the laser processing device 50 shown in FIG. 5.

Then, according to the flowchart shown in FIG. 6, the modified region forming step will be described with reference to FIGS. 3 to 5. In the laser processing device 50, the controlling unit 58, first, causes the not-shown robot arm to move the first substrate unit 30 from the load cassette 56a to the adsorptive stage 52 (step 201). Then, the controlling unit 58 causes the substrate unit 30 to be adsorbed to the adsorptive stage 52. Thereafter, the controlling unit 58 causes the adsorptive stage 52 to move in the X-direction and in the Y-direction and to rotate in the θ-direction to perform simple alignment so that the x-direction of the element-group formation substrate 20 provided to the substrate unit 30 coincides with the X-direction of the base body 51.

Next, the controlling unit 58 measures the thickness of the substrate 11 of the element-group forming substrate 20 provided in the substrate unit 30 and the thickness of the adhesive sheet 31, and sets the substrate back surface 11b as the reference plane ("0") to perform precise alignment of the element-group formation substrate 20 in the X-direction, Y-direction and θ-direction (step 202). It should be noted that the thickness of the substrate 11 and the thickness of the adhesive sheet 31 can be obtained from a difference in distance to the focal point between the cases where the substrate unit 30 is present and absent, which is measured by the optical system 63. In addition, in the precise alignment, the position of the adsorptive stage 52 is set so that the expected cutting lines (not shown) in the x-direction and the y-direction that are assumed to pass through boundary portions among the semiconductor light emitting elements 21 aligned in the element-group formation substrate 20 coincide with irradiation positions of the laser light 64 in the X-direction and the Y-direction, and scanning by the laser light 64 is performed along the expected cutting lines assumed on the element-group formation substrate 20. This setting may be performed by an operator of the laser processing device 50 with visual inspection, or automatically performed by the controlling unit 58 based on the image of the element-group formation substrate 20 ken by the image pickup unit 54.

Subsequently, the controlling unit 58 sets the focal point of the laser light 64 at a portion of the first depth D1 in the case of assuming the surface level of the substrate back surface 11b as "0" (step 203). It should be noted that, in this specific example, the first depth D1 is set less than the half of the substrate thickness Ts (D1<Ts/2). Here, positional adjustment of the focal point can be performed by adjustment of the optical system 63 or movement of the adsorptive stage 52 toward the Z-direction.

Next, the controlling unit 58 performs first scanning for forming the first modified region L1 as an example of a modified region at positions of the first depth D1 within the substrate 11 of the element-group formation substrate 20 along the y-direction and the −y-direction of the element-group formation substrate 20 by sequentially irradiating the element-group formation substrate 20 with the laser light 64 along the Y-direction and the −Y-direction of the base body 51 (step 204). It should be noted that step 204 corresponds to the step of forming the first modified region.

Upon completing the formation of the first modified region L1 in the element-group formation substrate 20, the controlling unit 58 sets the focal point of the laser light 64 at a portion of the second depth D2 in the case of assuming the surface level of the substrate back surface 11b as "0" (step 205). It should be noted that, in this specific example, the second depth D2 is set shallower than the first depth D1 (D1>D2).

Then, this time, the controlling unit 58 performs second scanning for forming the second modified region L2 as an example of other modified region at positions of the second depth D2 within the substrate 11 of the element-group formation substrate 20 along the x-direction and the −x-direction of the element-group formation substrate 20 by sequentially irradiating the element-group formation substrate 20, in which formation of the first modified region L1 has been finished, with the laser light 64 along the X-direction and the −X-direction of the base body 51 (step 206). It should be noted that step 206 corresponds to the step of forming the second modified region.

Upon completing the formation of the second modified region L2 in the element-group formation substrate 20, the controlling unit 58 sets the focal point of the laser light 64 at a portion of the third depth D3 in the case of assuming the surface level of the substrate back surface 11b as "0" (step 207). It should be noted that, in this specific example, the third depth D3 is set shallower than the second depth D2 (D2>D3).

Then, this time, the controlling unit 58 performs third scanning for forming the third modified region L3 at positions of the third depth D3 within the substrate 11 of the element-group formation substrate 20 along the y-direction and the −y-direction of the element-group formation substrate 20 by sequentially irradiating the element-group formation substrate 20, in which formation of the first modified region L1 and the second modified region L2 has been finished, with the laser light 64 along the Y-direction and the −Y-direction of the base body 51 (step 208). It should be noted that step 208 corresponds to the step of forming the third modified region.

Upon completing the formation of the third modified region L3 in the element-group formation substrate 20, the controlling unit 58 sets the focal point of the laser light 64 at a portion of the fourth depth D4 in the case of assuming the surface level of the substrate back surface 11b as "0" (step 209). It should be noted that, in this specific example, the fourth depth D4 is set shallower than the third depth D3 (D3>D4).

Then, this time, the controlling unit 58 performs fourth scanning for forming the fourth modified region L4 at positions of the fourth depth D4 within the substrate 11 of the element-group formation substrate 20 along the x-direction and the −x-direction of the element-group formation substrate 20 by sequentially irradiating the element-group formation substrate 20, in which formation of the first modified region L1 to the third modified region L3 has been finished, with the laser light 64 along the X-direction and the −X-direction of the base body 51 (step 210). It should be noted that step 210 corresponds to the step of forming the fourth modified region.

Upon completing formation of the first modified region L1 to the fourth modified region L4 in the substrate 11 of the element-group formation substrate 20 provided to the substrate unit 30 in this manner, the controlling unit 58 causes the not-shown robot arm to move the first substrate unit 30 from the adsorptive stage 52 to the unload cassette 57a (step 211).

Then, the controlling unit 58 determines whether or not the substrate unit 30 in the load cassette 56a is empty (whether or not the substrate unit 30 is left in the load cassette 56a) (step 212). Here, if it is determined that the substrate unit 30 is not left in the load cassette 56a, formation of the plural modified regions by the above-described laser processing is finished. On the other hand, if it is determined that the substrate unit 30 is left in the load cassette 56a, the process returns to step 201 to start formation of the plural modified regions in the next substrate unit 30. Hereinafter, with similar procedures, formation of the plural modified regions (in this specific example, the first modified region L1 to the fourth modified region L4) for all the substrate units 30 contained in the load cassettes 56a is performed.

Next, description will be given to each of the first scanning in step 204 and the first modified region L1 formed by the first scanning, the second scanning in step 206 and the second modified region L2 formed by the second scanning, the third scanning in step 208 and the third modified region L3 formed by the third scanning, and the fourth scanning in step 210 and the fourth modified region L4 formed by the fourth scanning. In addition, with respect to the first modified region L1, the second modified region L2, the third modified region L3 and the fourth modified region L4 formed in the substrate 11 of the element-group formation substrate 20, reciprocal relationship therebetween will also be described.

FIGS. 7A to 7D are diagrams each showing an example of a scanning direction of the laser light 64 in forming each of the first modified region L1 to the fourth modified region L4 in the modified region forming step of step 200. In addition, FIGS. 8A to 8D are diagrams each showing an example of a forming state and reciprocal relationship of each of the first modified region L1 to the fourth modified region L4 in the modified region forming step. Further, FIG. 9 is a diagram indicating an example of conditions and results in each of the first scanning (first modified region) to the fourth scanning (fourth modified region) in the modified region forming step.

Figure 7A:
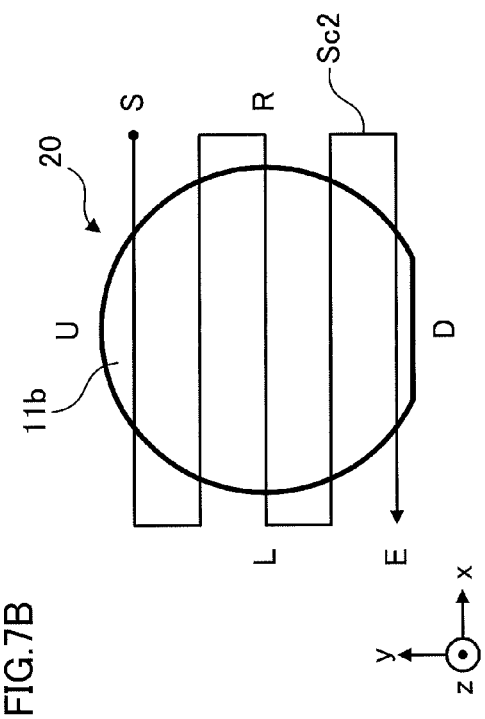
FIGS. 7A to 7D are diagrams each showing an example of a scanning direction of laser light in forming each of first modified region to fourth modified region in the modified region forming step.
Figure 7B:
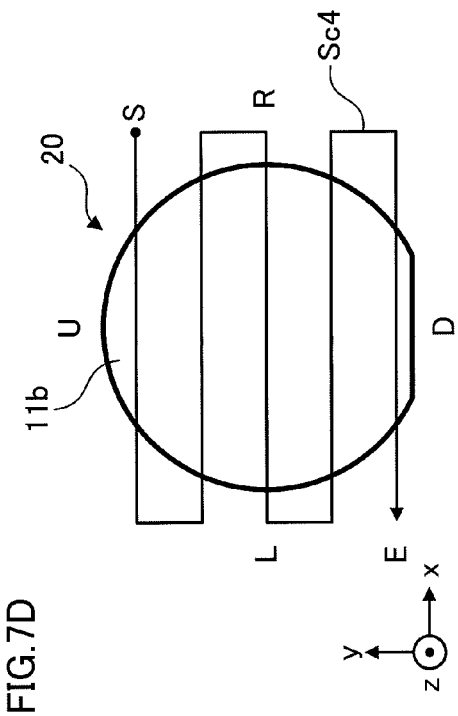
Figure 7C:
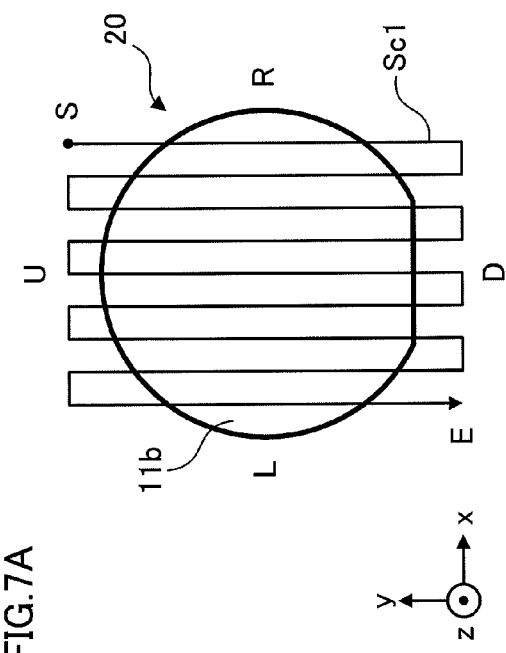
Figure 7D:
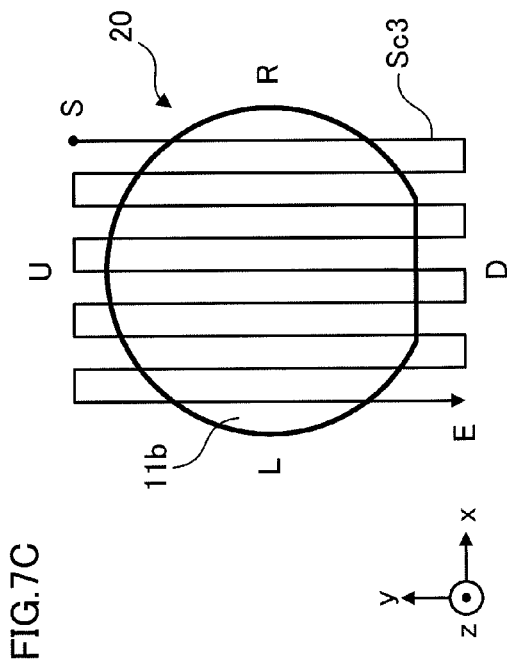
Figure 8A:
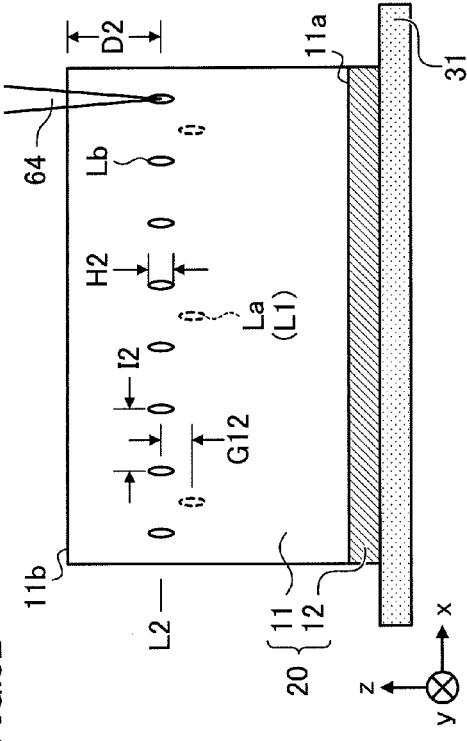
FIGS. 8A to 8D are diagrams each showing an example of a forming state and reciprocal relationship of each of the first modified region to the fourth modified region in the modified region forming step.
Figure 8B:
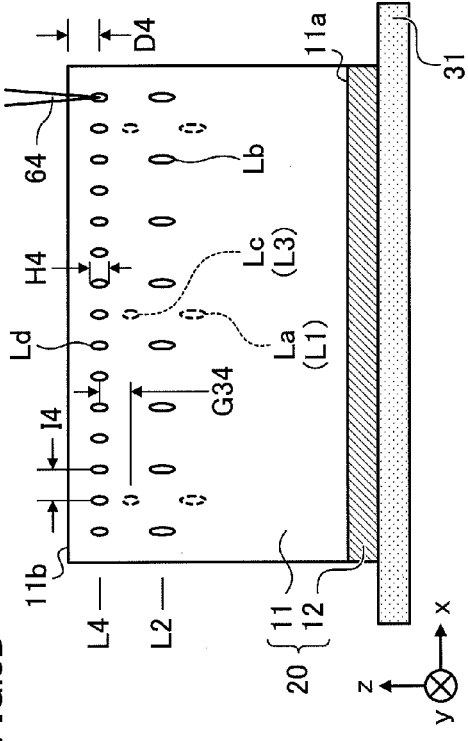
Figure 8C:
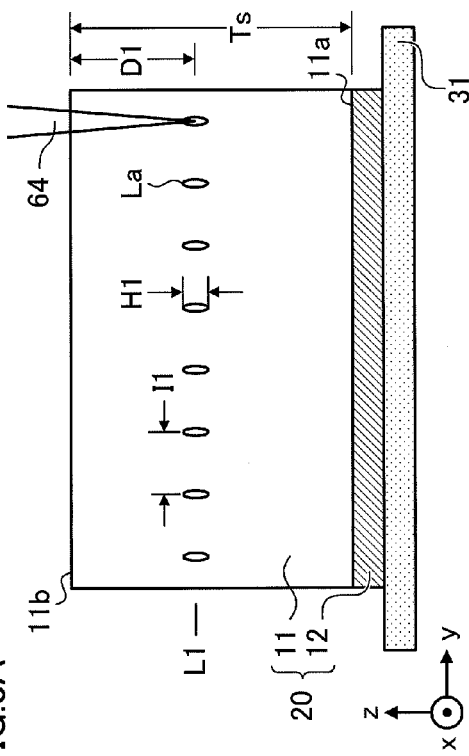
Figure 8D:
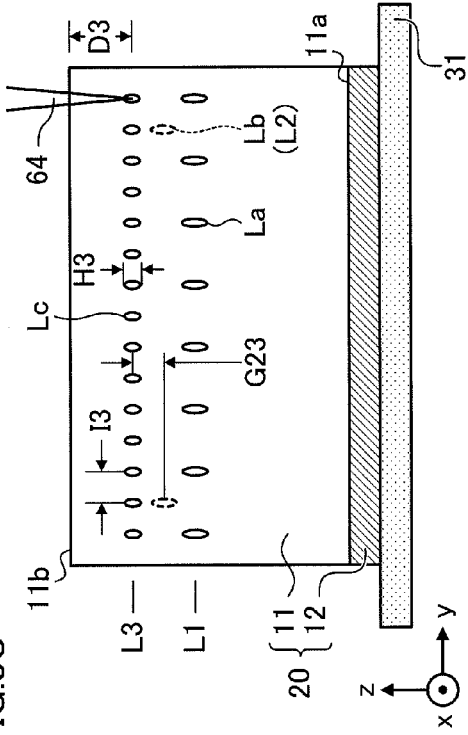

Here, FIGS. 7A and 8A correspond to the first scanning (formation of the first modified region L1) in step 204, FIGS. 7B and 8B correspond to the second scanning (formation of the second modified region L2) in step 206, FIGS. 7C and 8C correspond to the third scanning (formation of the third modified region L3) in step 208, and FIGS. 7D and 8D correspond to the fourth scanning (formation of the fourth modified region L4) in step 210. It should be noted that, hereinafter, description will be omitted with respect to the specific operation of the laser processing device 50, and description will be given with attention being focused on the relation between the laser light 64 emitted from the laser processing device 50 and the element-group formation substrate 20 (substrate 11) to be an object of irradiation with the laser light 64.

First, description will be given to the first scanning in step 204 and the first modified region L1 formed in the substrate 11 of the element-group formation substrate 20 by the first scanning.

In the first scanning, as shown in FIG. 7A, irradiation with the pulse-oscillated laser light 64 is performed from a starting position S, which is located in an upper right direction of the element-group formation substrate 20 and outside of the element-group formation substrate 20 in the figure, along a first scanning line Sc1 to an end position E, which is located in a lower left direction of the element-group formation substrate 20 and outside of the element-group formation substrate 20 in the figure. Here, an output of the laser light 64 per 1 pulse in the first scanning is referred to as a first output P1. Then, by performing irradiation with the laser light 64 along the first scanning line Sc1, the plural first modified regions L1 are sequentially formed in the element-group formation substrate 20 so as to be along the y-direction and the −y-direction, and in parallel with each other on an xy-plane from the R-end portion side to the L-end portion side.

During execution of the first scanning, as shown in FIG. 8A, the laser light 64 is incident on the element-group formation substrate 20 from the substrate back surface 11b of the substrate 11. The laser light 64 incident on the substrate 11 in the first scanning is focused on a portion of the first depth D1 in the substrate 11, and thereby an energy density of the position is increased. Accordingly, at the focal point of the laser light 64, the material constituting the substrate 11 (sapphire here) is modified by expansion, contraction or decomposition to cause cracking or the like, and thereby first modified portions La are formed at the positions of the first depth D1. It should be noted that, in the following, the length in the z-direction of the first modified portion La formed by the first scanning is referred to as a first height H1.

In addition, in the first scanning, every time the irradiation with the laser light 64 for 1 pulse is performed, the irradiation position on the element-group formation substrate 20 with the laser light 64 is sequentially moved to the y-direction or the −y-direction. Consequently, as the first scanning is performed, at the positions of the first depth D1 in the substrate 11 of the element-group formation substrate 20, the plural first modified portions La are sequentially formed along the y-direction or the −y-direction. Then, the plural first modified portions La aligned in the y-direction become the first modified region L1. It should be noted that, in the following, an interval between center portions of adjacent two first modified portions La in the y-direction is referred to as a first interval I1.

Next, description will be given to the second scanning in step 206 and the second modified region L2 formed in the substrate 11 of the element-group formation substrate 20 by the second scanning.

In the second scanning, as shown in FIG. 7B, irradiation with the pulse-oscillated laser light 64 is performed from a starting position S, which is located in an upper right direction of the element-group formation substrate 20 and outside of the element-group formation substrate 20 in the figure, along a second scanning line Sc2 to an end position E, which is located in a lower left direction of the element-group formation substrate 20 and outside of the element-group formation substrate 20 in the figure. Here, an output of the laser light 64 per 1 pulse in the second scanning is referred to as a second output P2. Then, by sequentially performing irradiation with the laser light 64 along the second scanning line Sc2, plural second modified regions L2 are sequentially formed in the element-group formation substrate 20 so as to be along the x-direction and the −x-direction, and in parallel with each other on an xy-plane from the U-end portion side to the D-end portion side.

During execution of the second scanning, as shown in FIG. 8B, the laser light 64 is incident on the element-group formation substrate 20 from the substrate back surface 11b of the substrate 11. The laser light 64 incident on the substrate 11 in the second scanning is focused on a portion of the second depth D2 in the substrate 11, and thereby an energy density of the position is increased. Accordingly, at the focal point of the laser light 64, the material constituting the substrate 11 (sapphire here) is modified by expansion, contraction or decomposition to cause cracking or the like, and thereby the second modified portions Lb are formed at the positions of the second depth D2. It should be noted that, in the following, the length in the z-direction of the second modified portion Lb formed by the second scanning is referred to as a second height H2.

In addition, in the second scanning, every time the irradiation with the laser light 64 for 1 pulse is performed, the irradiation position on the element-group formation substrate 20 with the laser light 64 is sequentially moved to the x-direction or the −x-direction. Consequently, as the second scanning is performed, at the positions of the second depth D2 in the substrate 11 of the element-group formation substrate 20, the plural second modified portions Lb are sequentially formed along the x-direction or the −x-direction. Then, the plural second modified portions Lb aligned in the x-direction become the second modified region L2. It should be noted that, in the following, an interval between center portions of adjacent two second modified portions Lb in the x-direction is referred to as a second interval 12.

In the first scanning in step 204, the plural first modified regions L1 are formed along the y-direction at the positions of the first depth D1 as viewed from the substrate back surface 11b, whereas, in the second scanning in step 206, the plural second modified regions L2 are formed along the x-direction at the positions of the second depth D2, which is shallower than the first depth D1, as viewed from the substrate back surface 11b. Accordingly, the first modified region L1 and the second modified region L2 intersect with each other as viewed from the z-direction side; however, actually, there is a "skewed" relationship. It should be noted that, in the following, an interval between the first modified region L1 and the second modified region L2 in the z-direction is referred to as a first-second gap G12.

This time, description will be given to the third scanning in step 208 and the third modified region L3 formed in the substrate 11 of the element-group formation substrate 20 by the third scanning.

In the third scanning, as shown in FIG. 7C, irradiation with the pulse-oscillated laser light 64 is performed from a starting position S, which is located in an upper right direction of the element-group formation substrate 20 and outside of the element-group formation substrate 20 in the figure, along a third scanning line Sc3 to an end position E, which is located in a lower left direction of the element-group formation substrate 20 and outside of the element-group formation substrate 20 in the figure. Here, an output of the laser light 64 per 1 pulse in the third scanning is referred to as a third output P3. Then, by performing irradiation with the laser light 64 along the third scanning line Sc3, the plural third modified regions L3 are sequentially formed in the element-group formation substrate 20 so as to be along the y-direction and the −y-direction, and in parallel with each other on an xy-plane from the R-end portion side to the L-end portion side. Here, the route of the third scanning line Sc3 on the element-group formation substrate 20 is the same as the route of the first scanning line Sc1 in the first scanning.

During execution of the third scanning, as shown in FIG. 8C, the laser light 64 is incident on the element-group formation substrate 20 from the substrate back surface 11b of the substrate 11. The laser light 64 incident on the substrate 11 in the third scanning is focused on a portion of the third depth D3 in the substrate 11, and thereby an energy density of the position is increased. Accordingly, at the focal point of the laser light 64, the material constituting the substrate 11 (sapphire here) is modified by expansion, contraction or decomposition to cause cracking or the like, and thereby third modified portions Lc are formed at the positions of the third depth D3. It should be noted that, in the following, the length in the z-direction of the third modified portion Lc formed by the third scanning is referred to as a third height H3.

In addition, in the third scanning, every time the irradiation with the laser light 64 for 1 pulse is performed, the irradiation position on the element-group formation substrate 20 with the laser light 64 is sequentially moved to the y-direction or the −y-direction. Consequently, as the third scanning is performed, at the positions of the third depth D3 in the substrate 11 of the element-group formation substrate 20, the plural third modified portions Lc are sequentially formed along the y-direction or the −y-direction. Then, the plural third modified portions Lc aligned in the y-direction become the third modified region L3. It should be noted that, in the following, an interval between center portions of adjacent two third modified portions Lc in the y-direction is referred to as a third interval 13.

In the second scanning in step 206, the plural second modified regions L2 are formed along the x-direction at the positions of the second depth D2 as viewed from the substrate back surface 11b, whereas, in the third scanning in step 208, the plural third modified regions L3 are formed along the y-direction at the positions of the third depth D3, which is shallower than the second depth D2, as viewed from the substrate back surface 11b. Accordingly, the second modified region L2 and the third modified region L3 intersect with each other as viewed from the z-direction side; however, actually, there is a "skewed" relationship. It should be noted that, in the following, an interval between the second modified region L2 and the third modified region L3 in the z-direction is referred to as a second-third gap G23.

Moreover, in the first scanning in step 204, the plural first modified regions L1 are formed along the y-direction at the positions of the first depth D1 as viewed from the substrate back surface 11b, whereas, in the third scanning in step 208, the plural third modified regions L3 are formed along the y-direction at the positions of the third depth D3, which is shallower than the first depth D1 and the second depth D2, as viewed from the substrate back surface 11b. Moreover, in this specific example, the first scanning line Sc1 in the first scanning and the third scanning line Sc3 in the third scanning are caused to coincide with each other on the element-group formation substrate 20. Consequently, the first modified region L1 and the third modified region L3 are formed in parallel with each other on a yz-plane. In addition, there is also a positional relationship in which the second modified region L2 passes between the first modified region L1 and the third modified region L3.

Finally, description will be given to the fourth scanning in step 210 and the fourth modified region L4 formed in the substrate 11 of the element-group formation substrate 20 by the fourth scanning.

In the fourth scanning, as shown in FIG. 7D, irradiation with the pulse-oscillated laser light 64 is performed from a starting position S, which is located in an upper right direction of the element-group formation substrate 20 and outside of the element-group formation substrate 20 in the figure, along a fourth scanning line Sc4 to an end position E, which is located in a lower left direction of the element-group formation substrate 20 and outside of the element-group formation substrate 20 in the figure. Here, an output of the laser light 64 per 1 pulse in the fourth scanning is referred to as a fourth output P4. Then, by performing irradiation with the laser light 64 along the fourth scanning line Sc4, the plural fourth modified regions L4 are sequentially formed in the element-group formation substrate 20 so as to be along the x-direction and the −x-direction, and in parallel with each other on an xy-plane from the U-end portion side to the D-end portion side. Here, the route of the fourth scanning line Sc4 on the element-group formation substrate 20 is the same as the route of the second scanning line Sc2 in the second scanning.

During execution of the fourth scanning, as shown in FIG. 8D, the laser light 64 is incident on the element-group formation substrate 20 from the substrate back surface 11b of the substrate 11. The laser light 64 incident on the substrate 11 in the fourth scanning is focused on a portion of the fourth depth D4 in the substrate 11, and thereby an energy density of the position is increased. Accordingly, at the focal point of the laser light 64, the material constituting the substrate 11 (sapphire here) is modified by expansion, contraction or decomposition to cause cracking or the like, and thereby fourth modified portions Ld are formed at the positions of the fourth depth D4. It should be noted that, in the following, the length in the z-direction of the fourth modified portion Ld formed by the fourth scanning is referred to as a fourth height H4.

In addition, in the fourth scanning, every time the irradiation with the laser light 64 for 1 pulse is performed, the irradiation position on the element-group formation substrate 20 with the laser light 64 is sequentially moved to the x-direction or the −x-direction. Consequently, as the fourth scanning is performed, at the positions of the fourth depth D4 in the substrate 11 of the element-group formation substrate 20, the plural fourth modified portions Ld are sequentially formed along the x-direction or the −x-direction. Then, the plural fourth modified portions Ld aligned in the x-direction become the fourth modified region L4. It should be noted that, in the following, an interval between center portions of adjacent two fourth modified portions Ld in the x-direction is referred to as a fourth interval I4.

In the third scanning in step 208, the plural third modified regions L3 are formed along the y-direction at the positions of the third depth D3 as viewed from the substrate back surface 11b, whereas, in the fourth scanning in step 210, the plural fourth modified regions L4 are formed along the x-direction at the positions of the fourth depth D4, which is shallower than the third depth D3, as viewed from the substrate back surface 11b. Accordingly, the third modified region L3 and the fourth modified region L4 intersect with each other as viewed from the z-direction side; however, actually, there is a "skewed" relationship. It should be noted that, in the following, an interval between the third modified region L3 and the fourth modified region L4 in the z-direction is referred to as a third-fourth gap G34.

Moreover, in the second scanning in step 206, the plural second modified regions L2 are formed along the x-direction at the positions of the second depth D2 as viewed from the substrate back surface 11b, whereas, in the fourth scanning in step 210, the plural fourth modified regions L4 are formed along the x-direction at the positions of the fourth depth D4, which is shallower than the first depth D1 to the third depth D3, as viewed from the substrate back surface 11b. Moreover, in this specific example, the second scanning line Sc2 in the second scanning and the fourth scanning line Sc4 in the fourth scanning are caused to coincide with each other on the element-group formation substrate 20. Consequently, the second modified region L2 and the fourth modified region L4 are formed in parallel with each other on an xz-plane. In addition, there is also a positional relationship in which the third modified region L3 passes between the second modified region L2 and the fourth modified region L4.

By performing the first scanning to the fourth scanning with the above-described procedures, the first modified region L1 to the fourth modified region L4 as an example of a modified region group are formed inside the substrate 11 of the element-group formation substrate 20. Here, the first modified region L1 and the third modified region L3 are formed so that the both are overlapped as viewed from the xy-plane, and each of them passes through the expected cutting line (y-direction) of each semiconductor light emitting element 21 along the y-direction. On the other hand, the second modified region L2 and the fourth modified region L4 are formed so that the both are overlapped as viewed from the xy-plane, and each of them passes through the expected cutting line (x-direction) of each semiconductor light emitting element 21 along the x-direction. In the exemplary embodiment, the y-direction and the x-direction correspond to the first direction and the second direction, respectively. Moreover, in the exemplary embodiment, the y-direction also corresponds to the third direction.

Moreover, in the exemplary embodiment, the first output P1 of the laser light 64 in the first scanning and the second output P2 of the laser light 64 in the second scanning are set to the same amplitude. Accordingly, the first height H1 of the first modified portions La formed inside the substrate 11 by the first scanning and the second height H2 of the second modified portions Lb formed inside the substrate 11 by the second scanning are approximately equal. Further, in the exemplary embodiment, the third output P3 of the laser light 64 in the third scanning is set smaller than the second output P2 of the laser light 64 in the second scanning. Accordingly, the third height H3 of the third modified portions Lc formed inside the substrate 11 by the third scanning is lower than the second height H2 of the second modified portions Lb formed inside the substrate 11 by the second scanning. Furthermore, the third output P3 of the laser light 64 in the third scanning and the fourth output P4 of the laser light 64 in the fourth scanning are set to the same amplitude. Accordingly, the third height H3 of the third modified portions Lc formed inside the substrate 11 by the third scanning and the fourth height H4 of the fourth modified portions Ld formed inside the substrate 11 by the fourth scanning are approximately equal.

Here, in the exemplary embodiment, the first-second gap G12, which is a distance in the z-direction between the first modified region L1 and the second modified region L2 adjacent in the z-direction, is set larger than the half of the sum of the first height H1 of the first modified portions La constituting the first modified region L1 and the second height H2 of the second modified portions Lb constituting the second modified region L2 (G12>(H1+H2)/2). Consequently, the first modified portion La and the second modified portion Lb are hardly integrated at the intersecting position as viewed from the xy-plane of the first modified region L1 and the second modified region L2 adjacent in the z-direction.

Moreover, in the exemplary embodiment, the second-third gap G23, which is a distance in the z-direction between the second modified region L2 and the third modified region L3 adjacent in the z-direction, is set larger than the half of the sum of the second height H2 of the second modified portions Lb constituting the second modified region L2 and the third height H3 of the third modified portions Lc constituting the third modified region L3 (G23>(H2+H3)/2). Consequently, the second modified portion Lb and the third modified portion Lc are hardly integrated at the intersecting position as viewed from the xy-plane of the second modified region L2 and the third modified region L3 adjacent in the z-direction.

Further, in the exemplary embodiment, the third-fourth gap G34, which is a distance in the z-direction between the third modified region L3 and the fourth modified region L4 adjacent in the z-direction, is set larger than the half of the sum of the third height H3 of the third modified portions Lc constituting the third modified region L3 and the fourth height H4 of the fourth modified portions Ld constituting the fourth modified region L4 (G34>(H3+H4)/2). Consequently, the third modified portion Lc and the fourth modified portion Ld are hardly integrated at the intersecting position as viewed from the xy-plane of the third modified region L3 and the fourth modified region L4 adjacent in the z-direction.

In addition, in the exemplary embodiment, the first interval I1 between the first modified portions La formed inside the substrate 11 by the first scanning and the second interval I2 between the second modified portions Lb formed inside the substrate 11 by the second scanning are approximately equal. Further, in the exemplary embodiment, the third interval 13 between the third modified portions Lc formed inside the substrate 11 by the third scanning is shorter than the second interval 12 between the second modified portions Lb formed inside the substrate 11 by the second scanning. Furthermore, in the exemplary embodiment, the third interval 13 between the third modified portions Lc formed inside the substrate 11 by the third scanning and the fourth interval 14 between the fourth modified portions Ld formed inside the substrate 11 by the fourth scanning are approximately equal.

Consequently, in the first modified region L1 and the third modified region L3 formed along the y-direction, the third modified region L3 that is closer to the substrate back surface 11b has the modified portions formed with shorter intervals (pitches) than the first modified region L1 that is closer to the substrate front surface 11a (laminated semiconductor layer 12). On the other hand, in the second modified region L2 and the fourth modified region L4 formed along the x-direction, the fourth modified region L4 that is closer to the substrate back surface 11b also has the modified portions formed with shorter intervals (pitches) than the second modified region L2 that is closer to the substrate front surface 11a (laminated semiconductor layer 12).

It should be noted that each of the first modified portions La constituting the first modified region L1, each of the second modified portions Lb constituting the second modified region L2, each of the third modified portions Lc constituting the third modified region L3 and each of the fourth modified portions Ld constituting the fourth modified region L4 are in a state where mechanical strength of the substrate 11 is reduced compared to that prior to modification.

Figure 10:
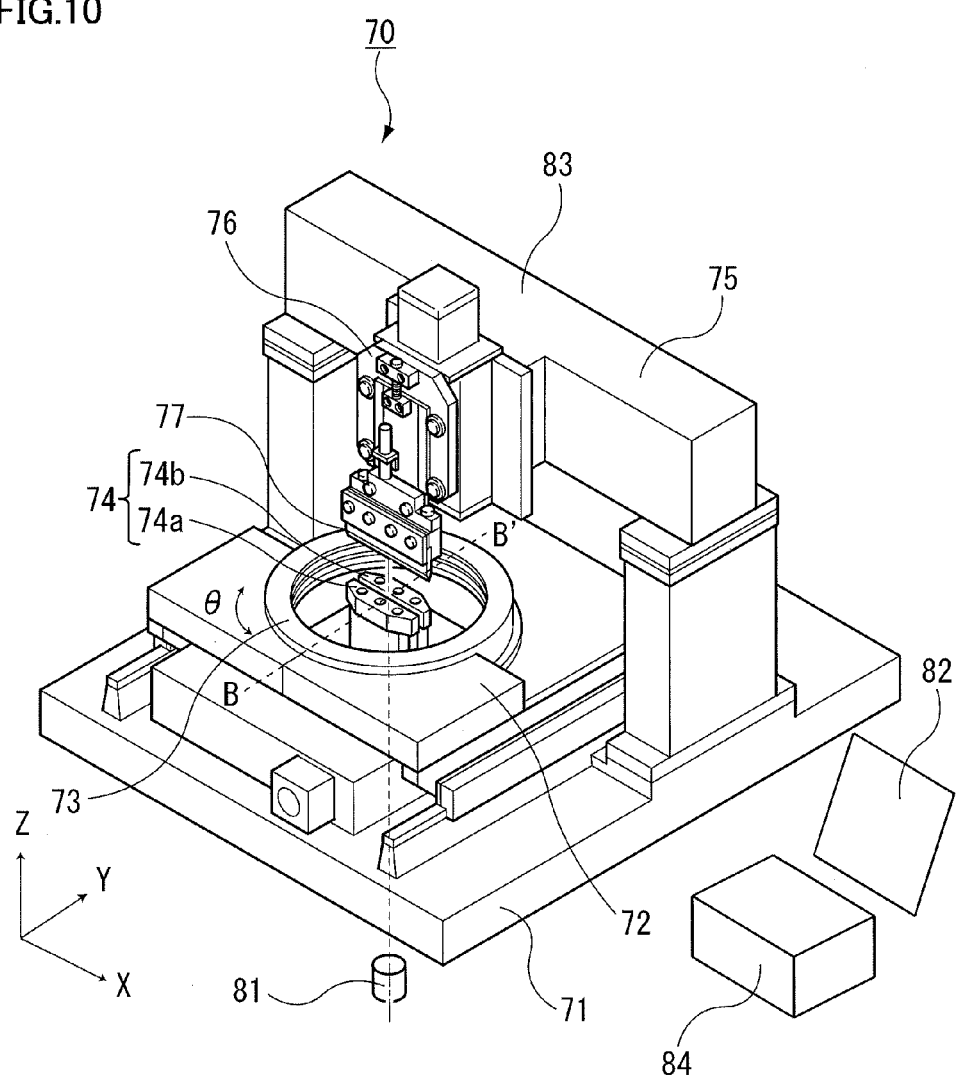
FIG. 10 is a perspective view showing an example of a configuration of a substrate cutting device used in the individual piece forming step.

FIG. 10 is a perspective view showing an example of a configuration of a substrate cutting device 70 used in the individual piece forming step of step 300.

The substrate cutting device 70 includes: a base body 71 to be placed on a table or the like; and a stage 72 that is provided on the base body 71 and movable in a to-and-fro direction (in the following description, referred to as a Y-direction). The stage 72 has a ring table 73 constituted by a ring-shaped frame that is rotatable (in the following description, the rotating direction is referred to as a O-direction) on the stage 72. On the ring table 73, the substrate unit 30, in which the first modified region L1 to the fourth modified region L4 have been formed on the element-group formation substrate 20 through the modified region forming step of step 200, is placed. Moreover, the substrate cutting device 70 further includes a receiving stage 74 that is attached to the base body 71 and arranged inside a ring of the ring table 73, to thereby hold the element-group formation substrate 20 constituting the substrate unit 30 through the adhesive sheet 31.

It should be noted that, to be described later, in the individual piece forming step, a process of covering the top surface side of the substrate unit 30, namely, the substrate back surface 11b side of the substrate 11 constituting the element-group formation substrate 20 with another sheet (hold sheet) is performed prior to attaching the substrate unit 30 to the substrate cutting device 70.

Moreover, the substrate cutting device 70 further includes: a gate-shaped support body 75 provided on the base body 71; and a blade holding body 76 supported by the support body 75. The blade holding body 76 holds a blade 77 at an end portion on a lower side thereof. It should be noted that the blade holding body 76 is supported by the support body 75 so as to be movable in the vertical direction (in the following description, referred to as a Z-direction) with respect to the base body 71 while holding the blade 77.

In the exemplary embodiment, the blade 77 has a function for cutting the element-group formation substrate 20 by being pressed into the element-group formation substrate 20 provided to the substrate unit 30 having been placed. Consequently, the blade 77 has a shape of a knife with a tip of, for example, 60°, and is manufactured with, for example, cemented carbide, zirconia or the like having high hardness. In addition, the length of the blade 77 in the X-direction is set longer than the diameter of the element-group formation substrate 20.

Moreover, the receiving stage 74 is configured with a first receiving stage 74a and a second receiving stage 74b arranged to face each other. The surface of each of the first receiving stage 74a and the second receiving stage 74b is made of, for example, the cemented carbide so as to be hardly deformed when the blade 77 is pressed into the element-group formation substrate 20. Then, when the blade 77 is moved in the direction of the receiving stage 74 (−Z-direction), the blade 77 is set to enter into a gap between the first receiving stage 74a and the second receiving stage 74b. Further, the surface of the ring table 73 and the surface of the receiving stage 74 are set to be included in an approximately one plane (XY-plane).

Moreover, the substrate cutting device 70 includes an image pickup unit 81 configured with, for example, a CCD camera or the like below the receiving table 74. The image pickup unit 81 is set so as to be able to take a photograph of the element-group formation substrate 20 on the receiving stage 74 through the gap between the first receiving stage 74a and the second receiving stage 74b. The substrate cutting device 70 further includes a display unit 82 that displays image data taken by the image pickup unit 81.

Further, the substrate cutting device 70 includes, in the support body 75, a driving unit 83 constituted by a stepping motor for moving the blade holding body 76 in the Z-direction, a motor for moving the stage 72 in the Y-direction, a motor for rotating the ring table 73 in the O-direction, an electronic circuit for controlling these motors, and the like.

In addition, the substrate cutting device 70 further includes a controlling unit 84 that extracts, from the image data taken by the image pickup unit 81, a pair of targets adjacent with an expected cutting line (in this specific example, the first modified region L1 and the third modified region L3 along the y-direction of the element-group formation substrate 20, or, the second modified region L2 and the fourth modified region L4 along the x-direction of the element-group formation substrate 20) interposed therebetween, and measures the distance between the targets, thereby determines the cutting state from a changing amount of the distance between the targets, and also controls operations of each constituent via the driving unit 83.

Then, more specific description will be given to the above-described individual piece forming step of step 300.

Figure 11:
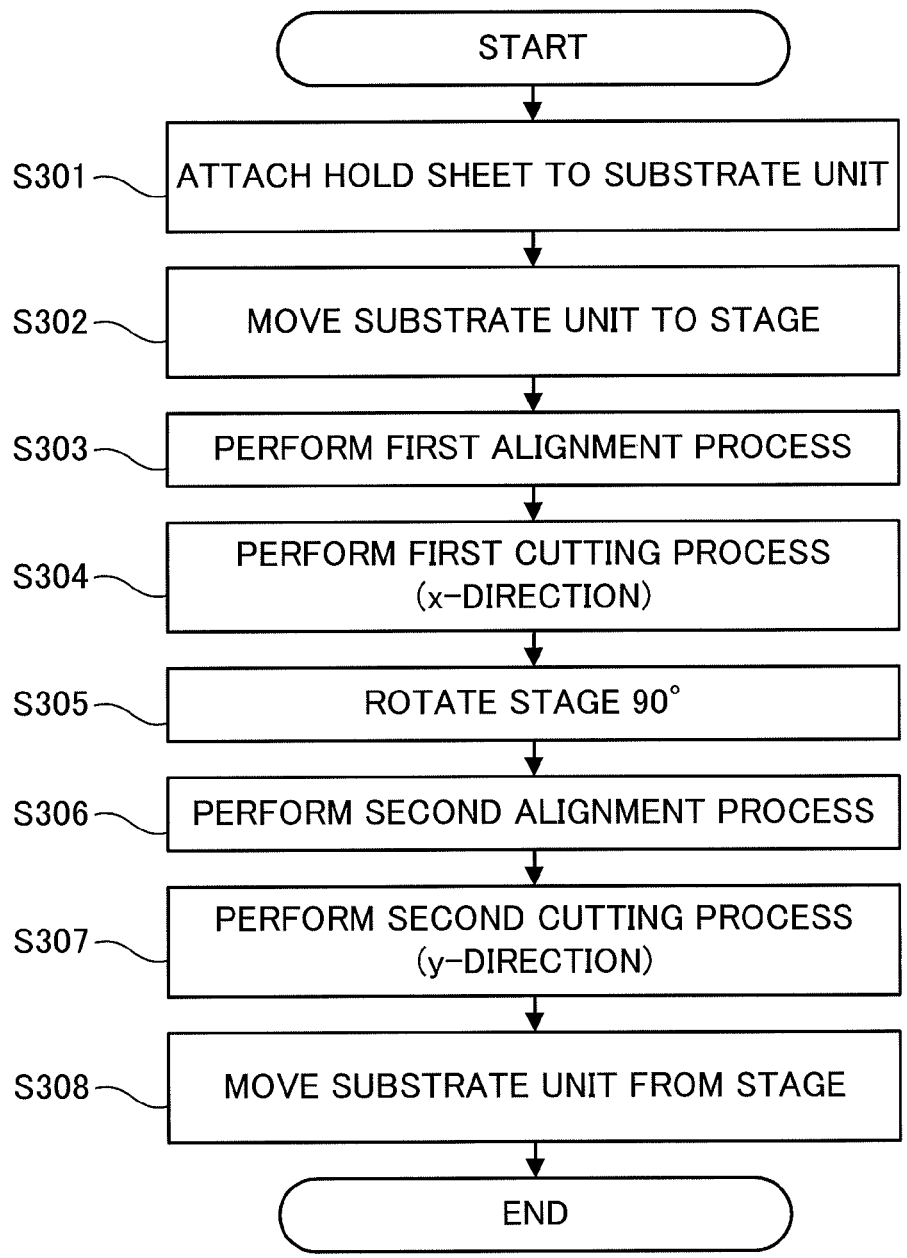
FIG. 11 is a flowchart showing an example of processing procedures in performing the individual piece forming step by use of the substrate cutting device.

FIG. 11 is a flowchart showing an example of processing procedures in performing the individual piece forming step of step 300 by use of the substrate cutting device 70 shown in FIG. 10.

Then, according to the flowchart shown in FIG. 11, the individual piece forming step will be described with reference to FIGS. 4 and 10.

First, a hold sheet 33 (refer to FIG. 12 to be described later) is attached to the substrate unit 30, in which processing by the modified region forming step of step 200 has been completed, so as to cover the entire surface on the substrate back surface 11c side of the substrate 11 of the element-group formation substrate 20 (step 301).

Next, in the substrate cutting device 70, the controlling unit 84 causes the substrate unit 30 to which the hold sheet 33 has been attached (in the following, including the hold sheet 33, simply referred to as a substrate unit 30) to be moved from the outside to the stage 72 by a not-shown robot arm (step 302). Then, based on image pickup results by the image pickup unit 81, the controlling unit 84 moves the stage 72 in the Y-direction and rotates thereof in the O-direction to perform a first alignment process for causing the x-direction of the element-group formation substrate 20 provided to the substrate unit 30 to coincide with the X-direction of the base body 71 (step 303).

Thereafter, the controlling unit 84 performs a first cutting process for cutting the element-group formation substrate 20 along the expected cutting line in the x-direction (here, the second modified region L2 and the fourth modified region L4 correspond thereto) by repeating movement of the blade 77 via the blade holding body 76 in the −Z-direction and Z-direction and movement of the substrate unit 30 (element-group formation substrate 20) via the stage 72 in the Y-direction (step 304). At this time, the blade 77 sequentially applies pressure to the element-group formation substrate 20 from the substrate back surface side 11b of the substrate 11 along the x-direction.

Upon completing the first cutting process, next, the controlling unit 84 rotates the substrate unit 30 (element-group formation substrate 20) 90° via the stage 72 (step 305). Then, based on image pickup results by the image pickup unit 81, the controlling unit 84 moves the stage 72 in the Y-direction and rotates thereof in the O-direction to perform a second alignment process for causing the y-direction of the element-group formation substrate 20 provided to the substrate unit 30 to coincide with the X-direction of the base body 71 (step 306).

Thereafter, the controlling unit 84 performs a second cutting process for cutting the element-group formation substrate 20 along the expected cutting line in the y-direction (here, the first modified region L1 and the third modified region L3 correspond thereto) by repeating movement of the blade 77 via the blade holding body 76 in the −Z-direction and Z-direction and movement of the substrate unit 30 (element-group formation substrate 20) via the stage 72 in the Y-direction (step 307). At this time, the blade 77 sequentially applies pressure to the element-group formation substrate 20 from the substrate back surface side 11b of the substrate 11 along the y-direction.

Through the above processes, the element-group formation substrate 20 provided to the substrate unit 30 is cut in each of the x-direction and the y-direction to be formed into individual pieces, and thereby plural element chips 10 (refer to FIG. 1) are provided. Here, in the exemplary embodiment, in the substrate unit 30, the formation side of the element-group formation substrate 20 prior to cutting on which the plural semiconductor light emitting elements 21 are formed is attached to the adhesive sheet 31, and moreover, the substrate 11 side (substrate back surface 11b side) of the element-group formation substrate 20 prior to cutting is covered with the hold sheet 33. Accordingly, the plural element chips 10 that have been formed into individual pieces by cutting are hardly scattered from the substrate unit 30.

Then, upon completing the second cutting process, the controlling unit 84 moves the substrate unit 30 that has been attached to the stage 72 from the stage 72 to the outside by the not-shown robot arm (step 308), thereby a series of processes is completed. It should be noted that, in the case where the next substrate unit 30 is ready, the process returns to step 301 to continue processing.

Next, description will be given to each of the first cutting process in step 304 and the second cutting process in step 307.

Figure 12A:
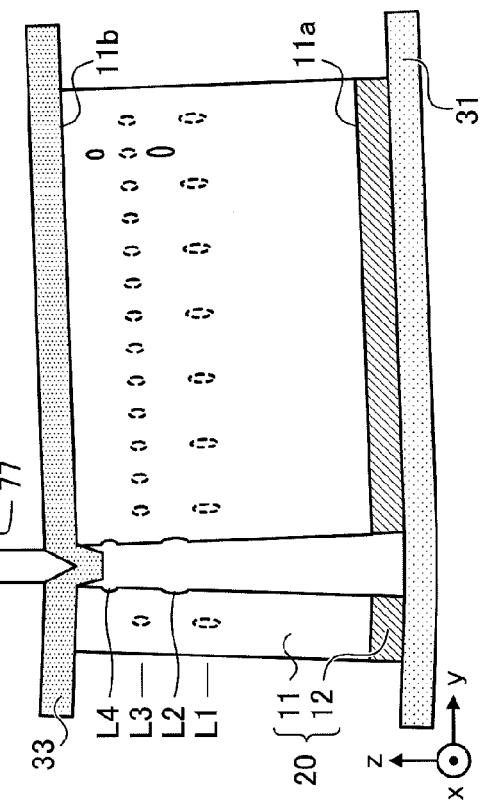
FIGS. 12A to 12D are diagrams showing an example of a first cutting process and a second cutting process of the individual piece forming step.
Figure 12B:
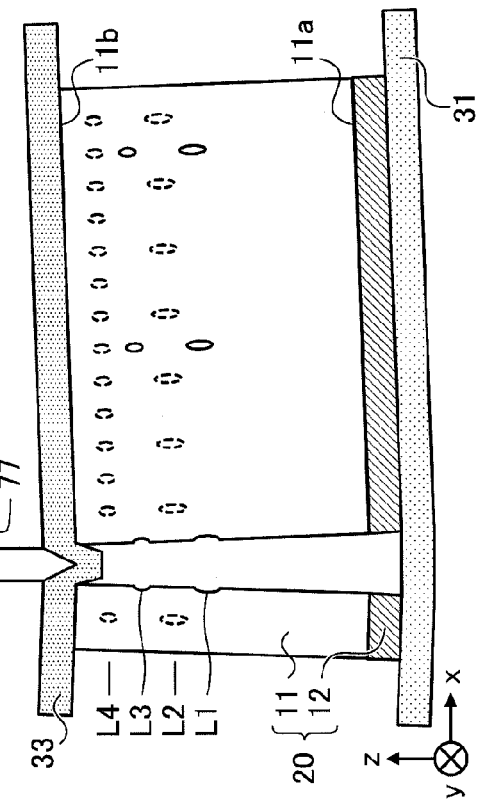
Figure 12C:
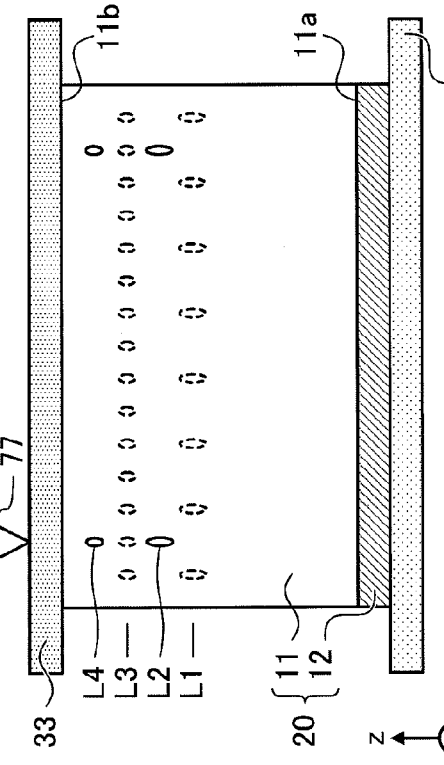
Figure 12D:
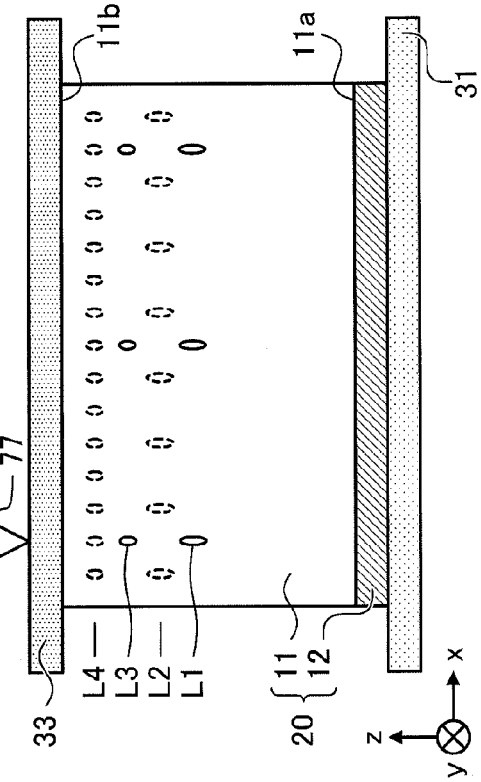

FIGS. 12A to 12D are diagrams showing an example of the first cutting process in step 304 and the second cutting process in step 307 of the individual piece forming step. Here, FIGS. 12A and 12B illustrate the first cutting process, and FIGS. 12C and 12D illustrate the second cutting process. It should be noted that, in FIGS. 12A to 12D, the configuration of the substrate cutting device 70 side is almost omitted, and only the blade 77 is shown.

As described above, in the individual piece forming step, the hold sheet 33 is applied onto the substrate back surface 11b of the substrate 11 in the element-group formation substrate 20.

Here, the hold sheet 33 is not required to have adhesiveness as the adhesive sheet 31, and can be configured with, for example, various kinds of resin materials; in the exemplary embodiment, as the hold sheet 33, polyethylene terephthalate (PET) having high stiffness is used.

Then, the first cutting process in step 304 will be described.

In the first cutting process, as shown in FIG. 12A, the tip end side of the blade 77 is placed along the x-direction of the element-group formation substrate 20. In addition, in the first cutting process, the tip end side of the blade 77 faces a position immediately above the second modified region L2 and the fourth modified region L4, each of which is formed along the x-direction, and which are placed side by side in the z-direction on the xz-plane, in the element-group formation substrate 20.

When the blade 77 is moved in the −z-direction in this state, the tip end side of the blade 77 contacts the hold sheet 33. Then, the pressure applied to the −z-direction from the tip end side of the blade 77 along the x-direction is also applied to the element-group formation substrate 20 through the hold sheet 33. At this time, on the −z-direction side (immediately below) than the tip end side of the blade 77, there exists the fourth modified region L4 that is along the x-direction and has lower strength than other portions, and further, on the −z-direction side (immediately below) than the fourth modified region L4, there exists the second modified region L2 that is along the x-direction and has lower strength than other portions.

Accordingly, by applying pressure to the element-group formation substrate 20 in the −z-direction by the blade 77, as shown in FIG. 12B, the substrate 11 is broken along the xz-plane from the fourth modified region L4 and the second modified region L2 as base points. Here, since the laminated semiconductor layer 12 is sufficiently thin compared to the substrate 11, as the substrate 11 is broken along the xz-plane, the laminated semiconductor layer 12 is also broken along the xz-plane.

Next, the second cutting process in step 307 will be described.

In the second cutting process, as shown in FIG. 12C, the tip end side of the blade 77 is placed along the y-direction of the element-group formation substrate 20. In addition, in the second cutting process, the tip end side of the blade 77 faces a position immediately above the first modified region L1 and the third modified region L3, each of which is formed along the y-direction, and which are placed side by side in the z-direction on the yz-plane, in the element-group formation substrate 20.

When the blade 77 is moved in the −z-direction in this state, the tip end side of the blade 77 contacts the hold sheet 33. Then, the pressure applied to the −z-direction from the tip end side of the blade 77 along the y-direction is also applied to the element-group formation substrate 20 through the hold sheet 33. At this time, on the −z-direction side (immediately below) than the tip end side of the blade 77, there exists the third modified region L3 that is along the y-direction and has lower strength than other portions, and further, on the −z-direction side (immediately below) than the third modified region L3, there exists the first modified region L1 that is along the y-direction and has lower strength than other portions.

Accordingly, by applying pressure to the element-group formation substrate 20 in the −z-direction by the blade 77, as shown in FIG. 12D, the substrate 11 is broken along the yz-plane from the third modified region L3 and the first modified region L1 as base points. Here, since the laminated semiconductor layer 12 is sufficiently thin compared to the substrate 11, as the substrate 11 is broken along the yz-plane, the laminated semiconductor layer 12 is also broken along the yz-plane.

Through each of these processes, the element chips 10 shown in FIG. 1 are obtained.

Figure 13:
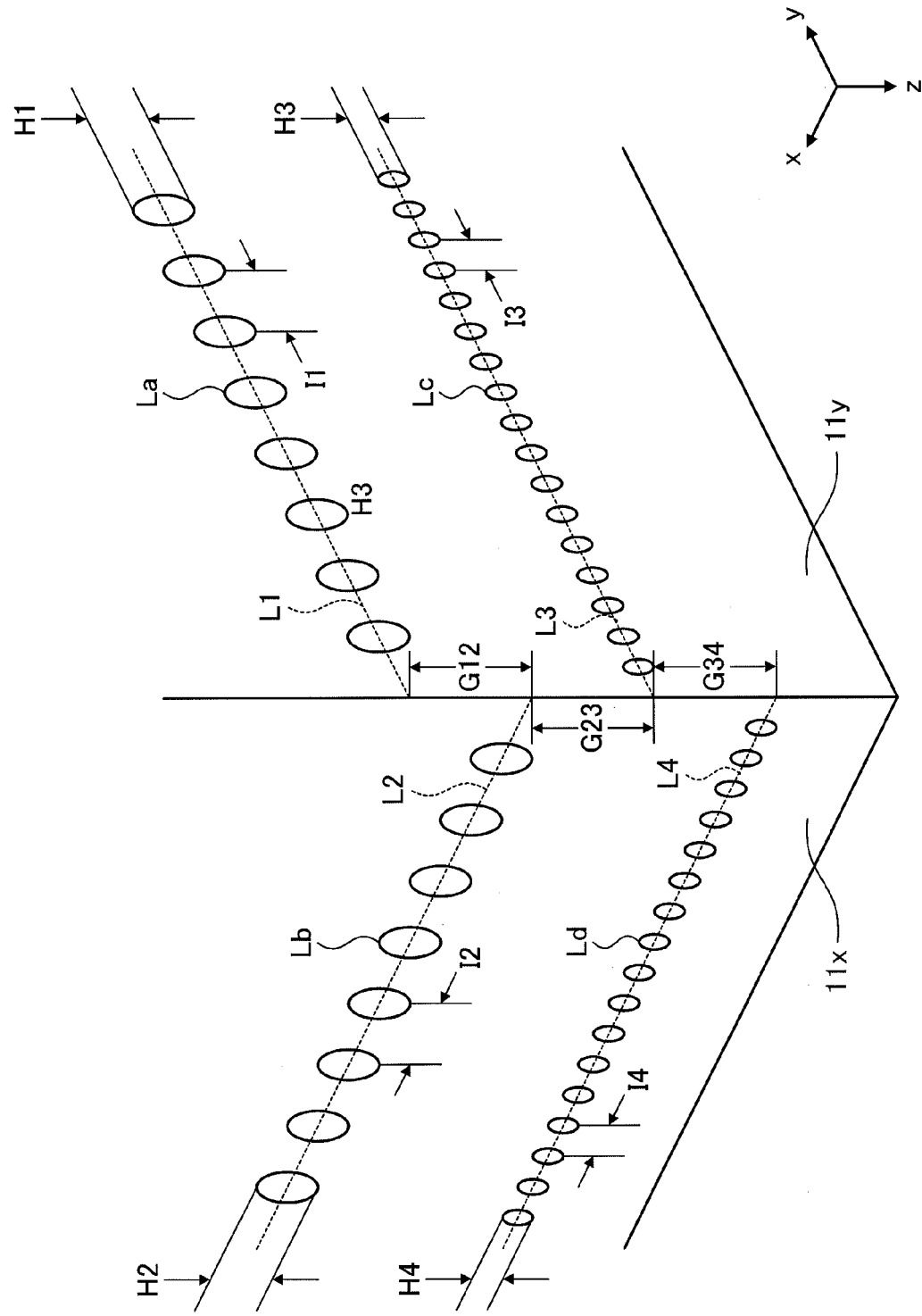
FIG. 13 is an enlarged perspective view showing an example of a cross-sectional structure of a substrate in the element chip obtained through the element group forming step, the modified region forming step and the individual piece forming step.

FIG. 13 is an enlarged perspective view showing an example of a cross-sectional structure of the substrate 11 in the element chip 10 (refer to FIG. 1) obtained through the element-group forming step of step 100, the modified region forming step of step 200 and the individual piece forming step of step 300.

In the exemplary embodiment, since division and formation into the individual pieces of the element-group formation substrate 20 is conducted by utilizing the first modified region L1 to the fourth modified region L4 formed by the above-described procedures, in the substrate 11 in the element chip 10, the first modified region L1 and the third modified region L3 are exposed on the substrate long side surface 11y side, and the second modified region L2 and the fourth modified region L4 are exposed on the substrate short side surface 11x side. Moreover, as described above, the first modified region L1 is configured with the plural first modified portions La arranged in line along the y-direction, the second modified region L2 is configured with the plural second modified portions Lb arranged in line along the x-direction, the third modified region L3 is configured with the plural third modified portions Lc arranged in line along the y-direction, and the fourth modified region L4 is configured with the plural fourth modified portions Ld arranged in line along the x-direction.

As described so far, in the exemplary embodiment, in the modified region forming step for forming the first modified region L1 and the third modified region L3 heading for the y-direction (corresponds to the first direction) along the surface of the substrate 11, and second modified region L2 and the fourth modified region L4 heading for the x-direction (corresponds to the second direction), which is different from the y-direction along the surface of the substrate 11 inside the substrate 11 by irradiating the element-group formation substrate 20, in which the plural semiconductor light emitting elements 21 are formed on the substrate front surface 11a of the wafer-shaped substrate 11 with the laser light 64 from the substrate back surface 11b side of the substrate, the first modified region L1, the second modified region L2, the third modified region L3 and the fourth modified region L4 were formed with different depths from the substrate back surface 11b of the substrate 11.

Here, of the procedures described above, a case will be considered in which, in the same substrate 11, the first depth D1 for forming the first modified region L1 and the second depth D2 for forming the second modified region L2 are set to be the same (hereinafter, referred to as a common depth D0). In this case, after forming the first modified region L1 is formed along the y-direction at the portion of the common depth D0 in the substrate 11 in the element-group forming substrate 20, the second modified region L2 is formed along the x-direction at the portion of the same common depth D0 in the substrate 11.

As viewed from the xy-plane, at an intersecting portion where the first modified region L1 and the second modified region L2 intersect, the laser light 64 incident from the substrate back surface 11b into the inside of the substrate 11 for forming the second modified portions Lb of the second modified region L2 is focused on the portion of the common depth D0. At this time, if there exist the first modified portions La of the first modified region L1 having been already formed at this position, the energy of the focused laser light 64 is not used for forming the second modified portions Lb, but directly passes through the first modified portions La. In particular, in the case where a crack (space) extending in the z-direction is formed in the first modified portion La, the laser light 64 focused to form the second modified portions Lb results in passing through the space inside the first modified portion La with almost no attenuation. Then, the laser light 64 passed through the first modified portion La is applied to the laminated semiconductor layer 12 provided to the substrate back surface 11b side in the state where the attenuation amount of energy is small.

If the laminated semiconductor layer 12 is irradiated with the laser light 64 in the state of insufficient energy attenuation in this way, at the irradiated portion of the laminated semiconductor layer 12, "discoloration" due to local change of properties occurs in the laminated semiconductor layer 12 with adsorption of the laser light 64. Then, in the case of occurrence of such "discoloration", of the plural element chips 10 obtained through the subsequent individual piece forming step, the element chip 10 including "discoloration" becomes a test failure due to poor appearance. Accordingly, with the occurrence of "discoloration", there is a possibility of reducing yields of the element chips 10.

It should be noted that, here, description has been given with the case where the first modified region L1 and the second modified region L2 are formed at the common depth D0 as an example; however, in the case where two modified regions with different directions (for example, the second modified region L2 and the third modified region L3, the third modified region L3 and the fourth modified region L4, and the first modified region L1 and the fourth modified region L4) are formed at the same common depth D0, there is a possibility that a similar problem occurs.

In contrast, in the exemplary embodiment, with the above-described configuration, it is possible to suppress occurrence of "discoloration" in the element-group formation substrate 20 in the formation of the plural modified regions by use of the laser light 64.

Moreover, in the exemplary embodiment, since the first depth D1 of the first modified region L1, which is to be first formed in the substrate 11 in the element-group formation substrate 20, is set less than the half of the substrate thickness Ts of the substrate 11 in the modified region forming step, it becomes possible to cause the laser light 64 heading for the laminated semiconductor layer 12 side without being used in forming each modified portion to reach the laminated semiconductor layer 12 side in the state where the energy density is reduced by enlarging a spot, and thereby it is possible to further suppress the occurrence of "discoloration" in the element-group formation substrate 20.

Further, in the exemplary embodiment, since the relation between the gap between two modified regions adjacent in the thickness direction (z-direction) of the substrate 11 and the height of each modified portion that constitutes these two modified regions are set in accordance with a predetermined numerical formula, a situation such that each modified portions of these two modified regions are connected in the thickness direction of the substrate 11 to be integrated is easily avoided, and as a result, it is possible to further suppress the occurrence of "discoloration" in the element-group formation substrate 20.

It should be noted that these will be described more specifically in a "first mode" and a "second mode" to be described later.

Moreover, in the exemplary embodiment, in the modified region forming step for forming the first modified region L1 and the third modified region L3 heading for the y-direction (corresponds to the first direction) along the surface of the substrate 11, and second modified region L2 and the fourth modified region L4 heading for the x-direction (corresponds to the second direction), which is different from the y-direction along the surface of the substrate 11 inside the substrate 11 by irradiating the element-group formation substrate 20, in which the plural semiconductor light emitting elements 21 are formed on the substrate front surface 11a of the wafer-shaped substrate 11 with the laser light 64 from the substrate back surface 11b side of the substrate, the first modified region L1 to the fourth modified region L4 were formed in order from the side closer to the substrate front surface 11a of the substrate 11 to the side farther thereto (from the side farther to the substrate back surface 11b to the side closer thereto), namely, in the order of the first modified region L1, the second modified region L2, the third modified region L3 and the fourth modified region L4.

Next, of the procedures described above, a case will be considered in which, after forming the second modified region L2 along the x-direction at the portion of the second depth D2 in the substrate 11, the first modified region L1 is formed along the y-direction at the portion of the first depth D1, which is deeper than the second depth D2, from the substrate back surface 11b in the same substrate 11.

As viewed from the xy-plane, at an intersecting portion where the first modified region L1 and the second modified region L2 intersect, the laser light 64 incident from the substrate back surface 11b into the inside of the substrate 11 for forming the first modified portions La of the first modified region L1 is applied so as to be focused on a portion of the first depth D1. At this time, if there exist the second modified portion Lb of the second modified region L2 having been already formed in an optical path of the laser light 64 started from the substrate back surface 11b to reach the focusing portion of the first depth D1, the laser light 64 is scattered by the second modified portion Lb before reaching the focusing portion, and thereby the first modified portion La is hardly formed at the portion of the first depth D1 and corresponding to the intersecting portion.

With respect to the region in which, of the first modified region L1, the first modified portion La is insufficiently formed in this way, there is a possibility that the cutting is performed in the state of being deviated from the expected cutting line in the subsequent individual piece forming step.

It should be noted that, here, description has been given with the case where the first modified region L1 and the second modified region L2 are formed in a reverse order as an example; however, in the case where two modified regions with different directions (for example, the second modified region L2 and the third modified region L3, the third modified region L3 and the fourth modified region L4, and the first modified region L1 and the fourth modified region L4) are formed in order from the side closer to the substrate back surface 11b to the side farther thereto, there is a possibility that a similar problem occurs.

This time, of the procedures described above, a case will be considered in which, after forming the third modified region L3 along the y-direction at the portion of the third depth D3 in the substrate 11, the first modified region L1 is formed along the y-direction and in parallel with the third modified region L3 in the yz-plane at the portion of the first depth D1, which is deeper than the third depth D3, from the substrate back surface 11b in the same substrate 11.

In this case, as viewed from the xy-plane, the first modified region L1 and the third modified region L3 overlap on a straight line along the y-direction. Consequently, before reaching the portion of the first depth D1, which is the target focal point, the laser light 64 incident from the substrate back surface 11b into the inside of the substrate 11 for forming the first modified portions La of the first modified region L1 is scattered by the third modified portion Lc of the third modified region L3 that has been already formed, and therefore, formation of the first modified region L1 constituted by the plural first modified portions La along the y-direction at the portion of the first depth D1 becomes insufficient.

In the case where the first modified region L1 is insufficiently formed in this way, there is a possibility that the cutting is performed in the state of being deviated from the expected cutting line in the subsequent individual piece forming step.

It should be noted that, here, description has been given with the case where the first modified region L1 and the third modified region L3 are formed in a reverse order as an example; however, in the case where two modified regions with the same direction (for example, the second modified region L2 and the fourth modified region L4) are formed in order from the side closer to the substrate back surface 11b to the side farther thereto, there is a possibility that a similar problem occurs.

In contrast, in the exemplary embodiment, with the above-described configuration, while suppressing the occurrence of "discoloration" in the element-group formation substrate 20 in the formation of the plural modified regions by use of the laser light 64, it is possible to suppress the occurrence of formation failure of the modified region due to scattering of the laser light 64 for forming a modified region by the modified region that has already been formed.

Moreover, in the exemplary embodiment, since the first depth D1 of the first modified region L1, which is to be first formed in the substrate 11 in the element-group formation substrate 20, is set less than the half of the substrate thickness Ts of the substrate 11 in the modified region forming step, it becomes possible to cause the laser light 64 heading for the laminated semiconductor layer 12 side without being used in forming each modified portion to reach the laminated semiconductor layer 12 side in the state where the energy density is reduced by enlarging a spot, and thereby it is possible to further suppress the occurrence of "discoloration" in the element-group formation substrate 20.

Further, in the exemplary embodiment, since the relation between the gap between two modified regions adjacent in the thickness direction (z-direction) of the substrate 11 and the height of each modified portion that constitutes these two modified regions are set in accordance with a predetermined numerical formula, a situation such that each modified portions of these two modified regions are connected in the thickness direction of the substrate 11 to be integrated is easily avoided, and as a result, it is possible to further suppress the occurrence of "discoloration" in the element-group formation substrate 20.

It should be noted that these will be described more specifically in a "third mode" to be described later.

Further, in the exemplary embodiment, in the modified region forming step for forming the first modified region L1 and the third modified region L3 heading for the y-direction (corresponds to the first direction) along the surface of the substrate 11, and second modified region L2 and the fourth modified region L4 heading for the x-direction (corresponds to the second direction), which is different from the y-direction along the surface of the substrate 11 inside the substrate 11 by irradiating the element-group formation substrate 20, in which the plural semiconductor light emitting elements 21 are formed on the substrate front surface 11a of the wafer-shaped substrate 11 with the laser light 64 from the substrate back surface 11b side of the substrate, the first modified region L1 to the fourth modified region L4 were formed in the order of the first modified region L1, the second modified region L2, the third modified region L3 and the fourth modified region L4 so that the direction of each of the first modified region L1 to the fourth modified region L4 is alternately the y-direction and the x-direction.

Here, of the procedures described above, a case will be considered in which setting for aligning the directions of two modified regions adjacent in the z-direction is provided. For example, a case in which the first modified region L1 and the second modified region L2 are sequentially formed along the x-direction, and subsequently, the third modified region L3 and the fourth modified region L4 are sequentially formed along the y-direction corresponds thereto.

In the case where the first modified region L1 to the fourth modified region L4 are to be formed in such an order and directions, there are some cases in which, after the formation of the first modified region L1 and the second modified region L2 in the substrate 11 is completed and before the formation of the third modified region L3 and the fourth modified region L4 is started, plural cracks along the y-direction occur, and further breaking occurs in the element-group formation substrate 20. Then, there is a possibility that the laser light 64 emitted for forming the third modified region L3 and the fourth modified region L4 in the substrate 11 deviates from the position of the original expected cutting line. In the case where such deviation occurs, of the plural element chips 10 obtained through the subsequent individual piece forming step, those including excessive dividing deviation become test failures due to shape defect. Accordingly, with the occurrence of deviation of the modified region, there is a possibility of reducing yields of the element chips 10.

It should be noted that, here, description has been given with the case where the first modified region L1 and the second modified region L2 are formed along the same direction as an example; however, in the case where two modified regions adjacent in the thickness direction of the substrate 11, namely, in the z-direction (for example, the second modified region L2 and the third modified region L3, and the third modified region L3 and the fourth modified region L4) are formed in the same direction, there is a possibility that a similar problem occurs.

In contrast, in the exemplary embodiment, with the above-described configuration, in the formation of the plural modified regions by use of the laser light 64, it is possible to suppress the occurrence of cracks and breaking in the element-group formation substrate 20, and it becomes possible to suppress the occurrence of shape defect of the element chips 10 after being formed into the individual pieces due to deviation of the plural modified regions formed in the element-group formation substrate 20 from the target expected cutting line.

Moreover, in the exemplary embodiment, since the first depth D1 of the first modified region L1, the second depth D2 of the second modified region L2, the third depth D3 of the third modified region L3 and the fourth depth D4 of the fourth modified region L4 are set less than the half of the substrate thickness Ts of the substrate 11 in the modified region forming step, it becomes possible to cause the laser light 64 heading for the laminated semiconductor layer 12 side without being used in forming each modified portion to reach the laminated semiconductor layer 12 side in the state where the energy density is reduced by enlarging a spot, and thereby it is possible to further suppress the occurrence of "discoloration" in the element-group formation substrate 20.

It should be noted that these will be described more specifically in a "fourth mode" to be described later.

In the exemplary embodiment, in the modified region forming step, the four modified regions, namely, the first modified region L1 to the fourth modified region L4 were formed in the element-group formation substrate 20 so as to be in order from the deeper side as viewed from the substrate back surface 11b alternately in the y-direction and the x-direction; however, not limited thereto. Moreover, in the exemplary embodiment, the y-direction was assumed to be the first direction and the x-direction was assumed to be the second direction; however, not limited thereto. Hereinafter, the above-described first mode, second mode, third mode and fourth mode will be described in order.

<First Mode>

Here, FIGS. 14A to 14C are diagrams showing lists of configuration examples of plural modified regions to which the first mode is applicable.

The first mode is applicable, of course, to the case where four modified regions (the first modified region L1 to the fourth modified region L4) as described in the exemplary embodiment, and is also applicable to the case of forming three modified regions (the first modified region L1 to the third modified region L3) and the case of forming two modified regions (the first modified region L1 and the second modified region L2). Here, FIG. 14A indicates, as an example, combination patterns of formation direction of each modified region in the case of forming the four modified regions, FIG. 14B indicates, as an example, combination patterns of formation direction of each modified region in the case of forming the three modified regions, and FIG. 14C indicates, as an example, combination patterns of formation direction of each modified region in the case of forming the two modified regions.

In FIG. 14A, as an example of forming the four modified regions (the first modified region L1 to the fourth modified region L4), 8 patterns ((1) to (8)) in which formation directions of respective modified regions are combined are shown. In this specific example, each modified region is formed in the order of the first modified region L1, the second modified region L2, the third modified region L3 and the fourth modified region L4. Moreover, in this specific example, the first modified region L1 is formed at the first depth D1, the second modified region L2 is formed at the second depth D2, the third modified region L3 is formed at the third depth D3 and the fourth modified region L4 is formed at the fourth depth D4. Here, the first depth D1, the second depth D2, the third depth D3 and the fourth depth D4 have a relation of D1>D2>D3>D4.

As shown in FIG. 14A, in the first mode, the first modified region L1 and the second modified region L2 are required to be configured with a combination of formation along the x-direction and formation along the y-direction. Accordingly, a case in which both of the first modified region L1 and the second modified region L2 are formed along the x-direction or the y-direction is excluded from the first mode.

Moreover, as shown in FIG. 14A, as basic patterns in forming the four modified regions, there are a first group (refer to (1) to (4)) in which the first modified region L1 is formed along the x-direction and the second modified region L2 is formed along the y-direction and a second group (refer to (5) to (8)) in which the modified region L1 is formed along the y-direction and the second modified region L2 is formed along the x-direction. Here, in (1) to (4) as shown in FIG. 14A, the x-direction and the y-direction correspond to the first direction and the second direction, respectively. Moreover, in (5) to (8) as shown in FIG. 14A, the y-direction and the x-direction correspond to the first direction and the second direction, respectively. It should be noted that, in the exemplary embodiment, description has been given by taking the combination shown in (7) in FIG. 14A as an example.

It should be noted that, here, description has been given by taking the case where the first depth D1, the second depth D2, the third depth D3 and the fourth depth D4 have a relation of D1>D2>D3>D4 as an example; however, not limited thereto, and the relation may be D1≠D2≠D3≠D4 within the range of the substrate thickness Ts of the substrate 11.

Next, in FIG. 14B, as an example of forming the three modified regions, 4 patterns ((1) to (4)) in which formation directions of respective modified regions are combined are shown. In this specific example, each modified region is formed in the order of the first modified region L1, the second modified region L2 and the third modified region L3. Moreover, in this specific example, the first modified region L1 is formed at the first depth D1, the second modified region L2 is formed at the second depth D2 and the third modified region L3 is formed at the third depth D3. Here, the first depth D1, the second depth D2 and the third depth D3 have a relation of D1>D2>D3.

As shown in FIG. 14B, in the first mode, the first modified region L1 and the second modified region L2 are required to be configured with a combination of formation along the x-direction and formation along the y-direction. Accordingly, a case in which both of the first modified region L1 and the second modified region L2 are formed along the x-direction or the y-direction is excluded from the first mode.

Moreover, as shown in FIG. 14B, as basic patterns in forming the three modified regions, there are a first group (refer to (1) and (2)) in which the first modified region L1 is formed along the x-direction and the second modified region L2 is formed along the y-direction and a second group (refer to (3) and (4)) in which the modified region L1 is formed along the y-direction and the second modified region L2 is formed along the x-direction. Here, in (1) and (2) as shown in FIG. 14B, the x-direction and the y-direction correspond to the first direction and the second direction, respectively. Moreover, in (3) and (4) as shown in FIG. 14B, the y-direction and the x-direction correspond to the first direction and the second direction, respectively.

It should be noted that, here, description has been given by taking the case where the first depth D1, the second depth D2 and the third depth D3 have a relation of D1>D2>D3 as an example; however, not limited thereto, and the relation may be D1≠D2≠D3 within the range of the substrate thickness Ts of the substrate 11.

Further, in FIG. 14C, as an example of forming the two modified regions, 2 patterns ((1) and (2)) in which formation directions of respective modified regions are combined are shown. In this specific example, each modified region is formed in the order of the first modified region L1 and the second modified region L2. Here, the first depth D1 and the second depth D2 have a relation of D1>D2.

As shown in FIG. 14C, in the first mode, the first modified region L1 and the second modified region L2 are required to be configured with a combination of formation along the x-direction and formation along the y-direction. Accordingly, a case in which both of the first modified region L1 and the second modified region L2 are formed along the x-direction or the y-direction is excluded from the first mode.

Moreover, as shown in FIG. 14C, as basic patterns in forming the two modified regions, there are one (refer to (1)) in which the first modified region L1 is formed along the x-direction and then the second modified region L2 is formed along the y-direction and one (refer to (2)) in which the modified region L1 is formed along the y-direction and then the second modified region L2 is formed along the x-direction. Here, in (1) shown in FIG. 14C, the x-direction and the y-direction correspond to the first direction and the second direction, respectively. Moreover, in (2) shown in FIG. 14C, the y-direction and the x-direction correspond to the first direction and the second direction, respectively. It should be noted that the combination shown in FIG. 14C is a fundamental of combinations in the first mode, and there exist inevitably one modified region formed along the x-direction and one modified region formed along the y-direction. Then, in this specific example, the first modified region L1 and the second modified region L2 correspond to "a modified region" and "other modified region", respectively.

<Second Mode>

Here, FIGS. 15A and 15B are diagrams showing lists of configuration examples of plural modified regions to which the second mode is applicable. The second mode is applicable, of course, to the case where four modified regions (the first modified region L1 to the fourth modified region L4) as described in the exemplary embodiment, and is also applicable to the case of forming three modified regions (the first modified region L1 to the third modified region L3). Here, FIG. 15A indicates, as an example, combination patterns of formation direction of each modified region in the case of forming the four modified regions, and FIG. 15B indicates, as an example, combination patterns of formation direction of each modified region in the case of forming the three modified regions.

In FIG. 15A, as an example of forming the four modified regions (the first modified region L1 to the fourth modified region L4), 14 patterns ((1) to (14)) in which formation directions of respective modified regions are combined are shown. In this specific example, each modified region is formed in the order of the first modified region L1, the second modified region L2, the third modified region L3 and the fourth modified region L4. Moreover, in this specific example, the first modified region L1 is formed at the first depth D1, the second modified region L2 is formed at the second depth D2, the third modified region L3 is formed at the third depth D3 and the fourth modified region L4 is formed at the fourth depth D4. Here, the first depth D1, the second depth D2, the third depth D3 and the fourth depth D4 have a relation of D1>D2>D3>D4.

As shown in FIG. 15A, in the second mode, the first modified region L1 to the fourth modified region L4 are required to be configured with a combination of formation along the x-direction and formation along the y-direction. Accordingly, a case in which all of the first modified region L1 to the fourth modified region L4 are formed along the x-direction or the y-direction is excluded from the second mode.

Moreover, as shown in FIG. 15A, as basic patterns in forming the four modified regions, there exist a first group (refer to (1), (2), (4) and (8)) in which, of the first modified region L1 to the fourth modified region L4, three are formed along the x-direction and the remaining one is formed along the y-direction, a second group (refer to (3), (5), (6), (9), (10), and (12)) in which two are formed along the x-direction and the remaining two are formed along the y-direction, and a third group (refer to (7), (11), (13) and (14)) in which one is formed along the x-direction and the remaining three are formed along the y-direction. Of these, in the second group, there is a case ((5) and (10)) in which formation is performed in the x-direction and in the y-direction alternately with respect to the z-direction (depth direction). Here, in (1) to (7) as shown in FIG. 15A, the x-direction and the y-direction correspond to the first direction and the second direction, respectively. Moreover, in (8) to Moreover, in (8) to (14) as shown in FIG. 15A, the y-direction and the x-direction correspond to the first direction and the second direction, respectively. It should be noted that, in the exemplary embodiment, description has been given by taking the combination shown in (10) in FIG. 15A as an example.

In the specific example shown in FIG. 15A, the first group can be utilized in a case where, for example, cutting in the x-direction is more difficult than in the y-direction due to the crystal structure or the like of the substrate 11. In addition, the first group can be utilized in a case where, for example, cutting in the x-direction is more difficult than in the y-direction due to the element chip 10 having a structure of Cx>Cy.

Moreover, the second group can be utilized in the case where, for example, cutting in each of the x-direction and the y-direction has similar difficulty. Then, in the case where, of the second group, the pattern of performing formation in the x-direction and in the y-direction alternately with respect to the z-direction (depth direction) is employed, for example, it becomes possible to suppress the occurrence of a situation in which the element-group formation substrate 20 is broken in the course of the modified region forming step compared to the case where, for example, of the first modified region L1 to the fourth modified region L4, two modified regions adjacent in the z-direction are set in the same orientation. Accordingly, for example, it is possible to suppress the occurrence of deviation of the modified region from the expected cutting line, which occurs in the case of further forming of the modified regions in the element-group formation substrate 20 in which breaking occurred.

Further, the third group can be utilized in a case where, for example, cutting in the y-direction is more difficult than in the x-direction due to the crystal structure or the like of the substrate 11. In addition, the third group can be utilized in a case where, for example, cutting in the y-direction is more difficult than in the x-direction due to the element chip 10 having a structure of Cx<Cy.

It should be noted that, of those shown in FIG. 15A, (2) to (13) correspond to the case in which, of the first modified region L1, the second modified region L2 and the third modified region L3, two modified regions are formed along the same direction (x-direction or y-direction) and other modified region is formed along the direction different from the same direction (y-direction or x-direction).

In addition, here, description has been given by taking the case where the first depth D1, the second depth D2, the third depth D3 and the fourth depth D4 have a relation of D1>D2>D3>D4 as an example; however, not limited thereto, and the relation may be D1≠D2≠D3≠D4 within the range of the substrate thickness Ts of the substrate 11.

Next, in FIG. 15B, as an example of forming the three modified regions, 6 patterns ((1) to (6)) in which formation directions of respective modified regions are combined are shown. In this specific example, each modified region is formed in the order of the first modified region L1, the second modified region L2 and the third modified region L3. Moreover, in this specific example, the first modified region L1 is formed at the first depth D1, the second modified region L2 is formed at the second depth D2 and the third modified region L3 is formed at the third depth D3. Here, the first depth D1, the second depth D2 and the third depth D3 have a relation of D1>D2>D3.

As shown in FIG. 15B, in the second mode, the first modified region L1 to the third modified region L3 are required to be configured with a combination of formation along the x-direction and formation along the y-direction. Accordingly, a case in which all of the first modified region L1 to the third modified region L3 are formed along the x-direction or the y-direction is excluded from the second mode.

Moreover, as shown in FIG. 15B, as basic patterns in forming the three modified regions, there exist a first group (refer to (1), (2) and (4)) in which, of the first modified region L1 to the third modified region L3, two are formed along the x-direction and the remaining one is formed along the y-direction, and a second group (refer to (3), (5) and (6)) in which one is formed along the x-direction and the remaining two are formed along the y-direction. In each of the first group and the second group, there is a case ((2) and (5)) in which formation is performed in the x-direction and in the y-direction alternately with respect to the z-direction (depth direction). Here, in (1) to (3) as shown in FIG. 15B, the x-direction and the y-direction correspond to the first direction and the second direction, respectively. Moreover, in (4) to (6) as shown in FIG. 15B, the y-direction and the x-direction correspond to the first direction and the second direction, respectively.

In the specific example shown in FIG. 15B, the first group can be utilized in a case where, for example, cutting in the x-direction is more difficult than in the y-direction due to the crystal structure or the like of the substrate 11. In addition, the first group can be utilized in a case where, for example, cutting in the x-direction is more difficult than in the y-direction due to the element chip 10 having a structure of Cx>Cy.

Moreover, the second group can be utilized in a case where, for example, cutting in the y-direction is more difficult than in the x-direction due to the crystal structure or the like of the substrate 11. In addition, the third group can be utilized in a case where, for example, cutting in the y-direction is more difficult than in the x-direction due to the element chip 10 having a structure of Cx<Cy.

Then, in the case where the pattern of performing formation in the x-direction and in the y-direction alternately with respect to the z-direction (depth direction) is employed, for example, it becomes possible to suppress the occurrence of a situation in which the element-group formation substrate 20 is broken in the course of the modified region forming step compared to the case where, for example, of the first modified region L1 to the third modified region L3, two modified regions adjacent in the z-direction are set in the same orientation. Accordingly, for example, it is possible to suppress the occurrence of deviation of the modified region from the expected cutting line, which occurs in the case of further forming of the modified regions in the element-group formation substrate 20 in which breaking occurred.

It should be noted that all of (1) to (6) shown in FIG. 15B correspond to the case in which, of the first modified region L1, the second modified region L2 and the third modified region L3, two modified regions are formed along the same direction (x-direction or y-direction) and other modified region is formed along the direction different from the same direction (y-direction or x-direction).

It should be noted that, here, description has been given by taking the case where the first depth D1, the second depth D2 and the third depth D3 have a relation of D1>D2>D3 as an example; however, not limited thereto, and the relation may be D1≠D2≠D3 within the range of the substrate thickness Ts of the substrate 11.

<Third Mode>

Here, FIGS. 16A to 16C are diagrams showing lists of configuration examples of plural modified regions to which the third mode is applicable.

The third mode is applicable, of course, to the case where four modified regions (the first modified region L1 to the fourth modified region L4) as described in the exemplary embodiment, and is also applicable to the case of forming three modified regions (the first modified region L1 to the third modified region L3) and the case of forming two modified regions (the first modified region L1 and the second modified region L2). Here, FIG. 16A indicates, as an example, combination patterns of formation direction of each modified region in the case of forming the four modified regions, FIG. 16B indicates, as an example, combination patterns of formation direction of each modified region in the case of forming the three modified regions, and FIG. 16C indicates, as an example, combination patterns of formation direction of each modified region in the case of forming the two modified regions.

In FIG. 16A, as an example of forming the four modified regions (the first modified region L1 to the fourth modified region L4), 14 patterns ((1) to (14)) in which formation directions of respective modified regions are combined are shown. In this specific example, each modified region is formed in the order of the first modified region L1, the second modified region L2, the third modified region L3 and the fourth modified region L4. Moreover, in this specific example, the first modified region L1 is formed at the first depth D1, the second modified region L2 is formed at the second depth D2, the third modified region L3 is formed at the third depth D3 and the fourth modified region L4 is formed at the fourth depth D4. Here, the first depth D1, the second depth D2, the third depth D3 and the fourth depth D4 have a relation of D1>D2>D3>D4.

As shown in FIG. 16A, in the third mode, the first modified region L1 to the fourth modified region L4 are required to be configured with a combination of formation along the x-direction and formation along the y-direction. Accordingly, a case in which all of the first modified region L1 to the fourth modified region L4 are formed along the x-direction or the y-direction is excluded from the third mode.

Moreover, as shown in FIG. 16A, as basic patterns in forming the four modified regions, there exist a first group (refer to (1), (2), (4) and (8)) in which, of the first modified region L1 to the fourth modified region L4, three are formed along the x-direction and the remaining one is formed along the y-direction, a second group (refer to (3), (5), (6), (9), (10), and (12)) in which two are formed along the x-direction and the remaining two are formed along the y-direction, and a third group (refer to (7), (11), (13) and (14)) in which one is formed along the x-direction and the remaining three are formed along the y-direction. Of these, in the second group, there is a case ((5) and (10)) in which formation is performed in the x-direction and in the y-direction alternately with respect to the z-direction (depth direction). Here, in (1) to (7) as shown in FIG. 16A, the x-direction and the y-direction correspond to the first direction and the second direction, respectively. Moreover, in (8) to (14) shown in FIG. 16A, the y-direction and the x-direction correspond to the first direction and the second direction, respectively. It should be noted that, in the exemplary embodiment, description has been given by taking the combination shown in (10) in FIG. 16A as an example.

In the specific example shown in FIG. 16A, the first group can be utilized in a case where, for example, cutting in the x-direction is more difficult than in the y-direction due to the crystal structure or the like of the substrate 11. In addition, the first group can be utilized in a case where, for example, cutting in the x-direction is more difficult than in the y-direction due to the element chip 10 having a structure of Cx>Cy.

Moreover, the second group can be utilized in the case where, for example, cutting in each of the x-direction and the y-direction has similar difficulty. Then, in the case where, of the second group, the pattern of performing formation in the x-direction and in the y-direction alternately with respect to the z-direction (depth direction) is employed, for example, it becomes possible to suppress the occurrence of a situation in which the element-group formation substrate 20 is broken in the course of the modified region forming step compared to the case where, for example, of the first modified region L1 to the fourth modified region L4, two modified regions adjacent in the z-direction are set in the same orientation. Accordingly, for example, it is possible to suppress the occurrence of deviation of the modified region from the expected cutting line, which occurs in the case of further forming of the modified regions in the element-group formation substrate 20 in which breaking occurred.

Further, the third group can be utilized in a case where, for example, cutting in the y-direction is more difficult than in the x-direction due to the crystal structure or the like of the substrate 11. In addition, the third group can be utilized in a case where, for example, cutting in the y-direction is more difficult than in the x-direction due to the element chip 10 having a structure of Cx<Cy.

It should be noted that, of those shown in FIG. 16A, (2) to (13) correspond to the case in which, of the first modified region L1, the second modified region L2 and the third modified region L3, two modified regions are formed along the same direction (x-direction or y-direction) and other modified region is formed along the direction different from the same direction (y-direction or x-direction).

Next, in FIG. 16B, as an example of forming the three modified regions, 6 patterns ((1) to (6)) in which formation directions of respective modified regions are combined are shown. In this specific example, each modified region is formed in the order of the first modified region L1, the second modified region L2 and the third modified region L3. Moreover, in this specific example, the first modified region L1 is formed at the first depth D1, the second modified region L2 is formed at the second depth D2 and the third modified region L3 is formed at the third depth D3. Here, the first depth D1, the second depth D2 and the third depth D3 have a relation of D1>D2>D3.

As shown in FIG. 16B, in the third mode, the first modified region L1 to the third modified region L3 are required to be configured with a combination of formation along the x-direction and formation along the y-direction. Accordingly, a case in which all of the first modified region L1 to the third modified region L3 are formed along the x-direction or the y-direction is excluded from the third mode.

Moreover, as shown in FIG. 16B, as basic patterns in forming the three modified regions, there exist a first group (refer to (1), (2) and (4)) in which, of the first modified region L1 to the third modified region L3, two are formed along the x-direction and the remaining one is formed along the y-direction, and a second group (refer to (3), (5) and (6)) in which one is formed along the x-direction and the remaining two are formed along the y-direction. In each of the first group and the second group, there is a case ((2) and (5)) in which formation is performed in the x-direction and in the y-direction alternately with respect to the z-direction (depth direction). Here, in (1) to (3) as shown in FIG. 16B, the x-direction and the y-direction correspond to the first direction and the second direction, respectively. Moreover, in (4) to (6) as shown in FIG. 16B, the y-direction and the x-direction correspond to the first direction and the second direction, respectively.

In the specific example shown in FIG. 16B, the first group can be utilized in a case where, for example, cutting in the x-direction is more difficult than in the y-direction due to the crystal structure or the like of the substrate 11. In addition, the first group can be utilized in a case where, for example, cutting in the x-direction is more difficult than in the y-direction due to the element chip 10 having a structure of Cx>Cy.

Moreover, the second group can be utilized in a case where, for example, cutting in the y-direction is more difficult than in the x-direction due to the crystal structure or the like of the substrate 11. In addition, the third group can be utilized in a case where, for example, cutting in the y-direction is more difficult than in the x-direction due to the element chip 10 having a structure of Cx<Cy.

Then, in the case where the pattern of performing formation in the x-direction and in the y-direction alternately with respect to the z-direction (depth direction) is employed, for example, it becomes possible to suppress the occurrence of a situation in which the element-group formation substrate 20 is broken in the course of the modified region forming step compared to the case where, for example, of the first modified region L1 to the third modified region L3, two modified regions adjacent in the z-direction are set in the same orientation. Accordingly, for example, it is possible to suppress the occurrence of deviation of the modified region from the expected cutting line, which occurs in the case of further forming of the modified regions in the element-group formation substrate 20 in which breaking occurred.

It should be noted that all of (1) to (6) shown in FIG. 16B correspond to the case in which, of the first modified region L1, the second modified region L2 and the third modified region L3, two modified regions are formed along the same direction (x-direction or y-direction) and other modified region is formed along the direction different from the same direction (y-direction or x-direction).

Further, in FIG. 16C, as an example of forming the two modified regions, 2 patterns ((1) and (2)) in which formation directions of respective modified regions are combined are shown. In this specific example, each modified region is formed in the order of the first modified region L1 and the second modified region L2. Here, the first depth D1 and the second depth D2 have a relation of D1>D2.

As shown in FIG. 16C, in the third mode, the first modified region L1 and the second modified region L2 are required to be configured with a combination of formation along the x-direction and formation along the y-direction. Accordingly, a case in which both of the first modified region L1 and the second modified region L2 are formed along the x-direction or the y-direction is excluded from the third mode.

Moreover, as shown in FIG. 16C, as basic patterns in forming the two modified regions, there are one (refer to (1)) in which the first modified region L1 is formed along the x-direction and then the second modified region L2 is formed along the y-direction and one (refer to (2)) in which the modified region L1 is formed along the y-direction and then the second modified region L2 is formed along the x-direction. Here, in (1) shown in FIG. 16C, the x-direction and the y-direction correspond to the first direction and the second direction, respectively. Moreover, in (2) shown in FIG. 16C, the y-direction and the x-direction correspond to the first direction and the second direction, respectively. It should be noted that the combination shown in FIG. 16C is a fundamental of combinations in the first mode, and there exist inevitably one modified region formed along the x-direction and one modified region formed along the y-direction. Then, in this specific example, the first modified region L1 and the second modified region L2 correspond to "a modified region" and "other modified region", respectively.

<Fourth Mode>

Here, FIGS. 17A and 17B are diagrams showing lists of configuration examples of plural modified regions to which the fourth mode is applicable.

The fourth mode is applicable, of course, to the case where four modified regions (the first modified region L1 to the fourth modified region L4) as described in the exemplary embodiment, and is also applicable to the case of forming three modified regions (the first modified region L1 to the third modified region L3). Here, FIG. 17A indicates, as an example, combination patterns of formation direction of each modified region in the case of forming the four modified regions, and FIG. 17B indicates, as an example, combination patterns of formation direction of each modified region in the case of forming the three modified regions.

In FIG. 17A, as an example of forming the four modified regions (the first modified region L1 to the fourth modified region L4), 2 patterns ((1) and (2)) in which formation directions of respective modified regions are combined are shown. In this specific example, each modified region is formed in the order of the first modified region L1, the second modified region L2, the third modified region L3 and the fourth modified region L4. Moreover, in this specific example, the first modified region L1 is formed at the first depth D1, the second modified region L2 is formed at the second depth D2, the third modified region L3 is formed at the third depth D3 and the fourth modified region L4 is formed at the fourth depth D4. Here, the first depth D1, the second depth D2, the third depth D3 and the fourth depth D4 have a relation of D1>D2>D3>D4.

As shown in FIG. 17A, in the fourth mode, there exist one (refer to (1)) in which the first modified region L1 to the fourth modified region L4 are formed first in the x-direction in the order of x, y, x, y, and one (refer to (2)) in which the first modified region L1 to the fourth modified region L4 are formed first in the y-direction in the order of y, x, y, x. Here, in (1) shown in FIG. 17A, the x-direction and the y-direction correspond to the first direction and the second direction, respectively. Moreover, in (2) shown in FIG. 17A, the y-direction and the x-direction correspond to the first direction and the second direction, respectively. It should be noted that, in the exemplary embodiment, description has been given by taking the combination shown in (2) in FIG. 17A as an example.

It should be noted that, here, description has been given by taking the case where the first depth D1, the second depth D2, the third depth D3 and the fourth depth D4 have a relation of D1>D2>D3>D4 as an example; however, not limited thereto, and the relation may be D1≠D2≠D3≠D4 within the range of the substrate thickness Ts of the substrate 11, or at least two of the first depth D1 to the fourth depth D4 may be the same.

Next, in FIG. 17B, as an example of forming the three modified regions, 2 patterns ((1) and (2)) in which formation directions of respective modified regions are combined are shown. In this specific example, each modified region is formed in the order of the first modified region L1, the second modified region L2 and the third modified region L3. Moreover, in this specific example, the first modified region L1 is formed at the first depth D1, the second modified region L2 is formed at the second depth D2 and the third modified region L3 is formed at the third depth D3. Here, the first depth D1, the second depth D2 and the third depth D3 have a relation of D1>D2>D3.

As shown in FIG. 17B, in the fourth mode, there exist one (refer to (1)) in which the first modified region L1 to the third modified region L3 are formed first in the x-direction in the order of x, y, x, and one (refer to (2)) in which the first modified region L1 to the third modified region L3 are formed first in the y-direction in the order of y, x, y. Here, in (1) shown in FIG. 17B, the x-direction and the y-direction correspond to the first direction and the second direction, respectively. Moreover, in (2) shown in FIG. 17B, the y-direction and the x-direction correspond to the first direction and the second direction, respectively.

It should be noted that, here, description has been given by taking the case where the first depth D1, the second depth D2 and the third depth D3 have a relation of D1>D2>D3 as an example; however, not limited thereto, and the relation may be D1≠D2≠D3 within the range of the substrate thickness Ts of the substrate 11, or at least two of the first depth D1 to the third depth D3 may be the same.

It should be noted that, in the exemplary embodiment, each modified region was formed by use of the pulse-oscillated YAG (yttrium aluminum garnet) laser light; however, not limited thereto. In addition, the wavelength of the laser light used for forming each modified region may be appropriately redesigned.

Moreover, in the exemplary embodiment, the output of the laser light 64 in forming each modified region was set in the relationship of P1=P2>P3=P4; however, not limited thereto, and the magnitude relationship of the output may be altered.

Further, in the exemplary embodiment, the substrate front surface 11a and the substrate back surface 11b in the substrate 11 were formed in a rectangular shape by causing the substrate short side surface 11x and the substrate long side surface 11y in the substrate 11 of the element chip 10 to form a right angle; however, not limited thereto, and the substrate front surface 11a and the substrate back surface 11b in the substrate 11 may be formed in a shape of a parallelogram without causing the angle formed by the substrate short side surface 11x and the substrate long side surface 11y in the substrate 11 of the element chip 10 to be a right angle.

Furthermore, in the exemplary embodiment, description has been given by taking the semiconductor light emitting element 21 as an example of the electronic element to be formed on the substrate 11; however, not limited thereto, and one without light emitting function may be allowable.

REFERENCE SIGNS LIST

10 . . . Element chip
11 . . . Substrate
11a . . . Substrate front surface
11b . . . Substrate back surface
11x . . . Substrate short side surface
11y . . . Substrate long side surface
12 . . . Laminated semiconductor layer
13a, 13b . . . Electrode
20 . . . Element-group formation substrate
21 . . . Semiconductor light emitting element
30 . . . Substrate unit
50 . . . Laser processing device
70 . . . Substrate cutting device
L1 . . . First modified region
L2 . . . Second modified region
L3 . . . Third modified region
L4 . . . Fourth modified region
La . . . First modified portion
Lb . . . Second modified portion
Lc . . . Third modified portion
Ld . . . Fourth modified portion
D1 . . . First depth
D2 . . . Second depth
D3 . . . Third depth
D4 . . . Fourth depth
Ts . . . Substrate thickness

The invention claimed is:

1. A laser processing method in which a modified region in a first direction being along a surface of a plate-shaped substrate and other modified region in a second direction being along the surface of the substrate and different from the first direction are formed inside the substrate by irradiating an element-group formation substrate, in which a plurality of electronic elements are formed on a front surface of the substrate, with laser light from a back surface side of the substrate, the method comprising:
forming the modified region and the other modified region with different depths from the back surface of the substrate.

2. The laser processing method according to claim 1, wherein the modified region and the other modified region are formed on a side closer to the back surface than a center of a thickness direction from the front surface to the back surface of the substrate.

3. The laser processing method according to claim 1, wherein the first direction is along a first arrangement direction of the plurality of electronic elements on the element-group formation substrate, and the second direction is along a second arrangement direction of the plurality of electronic elements on the element-group formation substrate.

4. The laser processing method according to claim 1, wherein the substrate is composed of sapphire and the plurality of electronic elements include a group III nitride semiconductor layer.

5. The laser processing method according to claim 1, wherein the modified region is formed at a portion where a depth thereof from the back surface of the substrate is a first depth, and thereafter, the other modified region is formed at a portion where a depth thereof from the back surface of the substrate is a second depth, which is shallower than the first depth.

6. A laser processing method comprising:
a step of forming a first modified region along a first direction inside a substrate by sequentially irradiating an element-group formation substrate, in which a plurality of electronic elements are formed on a front surface of the substrate having a plate shape, with laser light in the first direction being along a surface of the substrate from a back surface side of the substrate and by sequentially focusing the laser light at a portion inside the substrate where a depth thereof from the back surface is a first depth;
a step of forming a second modified region along a second direction inside the substrate by sequentially irradiating the element-group formation substrate, in which the first modified region has been formed, with laser light in the second direction being along a surface of the substrate from a back surface side of the substrate and by sequentially focusing the laser light at a portion inside the substrate where a depth thereof from the back surface is a second depth, which is different from the first depth; and a step of forming a third modified region along a third direction inside the substrate by sequentially irradiating the element-group formation substrate, in which the first modified region and the second modified region have been formed, with laser light in the third direction being along a surface of the substrate from a back surface side of the substrate and by sequentially focusing the laser light at a portion inside the substrate where a depth thereof from the back surface is a third depth, which is different from the first depth and the second depth, wherein, of the first modified region, the second modified region and the third modified region, two modified regions are formed along a same direction, and one other modified region is formed along a direction different from the same direction.

7. The laser processing method according to claim 6, wherein the two modified regions along the same direction are formed to overlap in a thickness direction of the substrate.

8. The laser processing method according to claim 6, wherein, in the step of forming the second modified region, the second depth at which the second modified region is formed is made shallower than the first depth, and in the step of forming the third modified region, the third depth at which the third modified region is formed is made shallower than the second depth.

9. The laser processing method according to claim 6, further comprising:

a step of forming a fourth modified region along the different direction inside the substrate by sequentially irradiating the element-group formation substrate, in which the first modified region, the second modified region and the third modified region have been formed, with laser light in the different direction being along a surface of the substrate from a back surface side of the substrate and by sequentially focusing the laser light at a portion inside the substrate where a depth thereof from the back surface is a fourth depth, which is different from the first depth, the second depth and the third depth.

10. The laser processing method according to claim 6, further comprising:

a step of forming a fourth modified region along the same direction inside the substrate by sequentially irradiating the element-group formation substrate, in which the first modified region, the second modified region and the third modified region have been formed, with laser light in the same direction being along a surface of the substrate from a back surface side of the substrate and by sequentially focusing the laser light at a portion inside the substrate where a depth thereof from the back surface is a fourth depth, which is different from the first depth, the second depth and the third depth.

11. The laser processing method according to claim 6, wherein the substrate is composed of sapphire and the plurality of electronic elements include a group III nitride semiconductor layer.

12. The laser processing method according to claim 6, wherein the first direction and the third direction are assumed to be the same direction, and the second direction is assumed to be the different direction.

13. The laser processing method according to claim 6, wherein the substrate constituting the element-group formation substrate has a structure that is hardly broken in the same direction than in the different direction.

14. The laser processing method according to claim 6, wherein, in a case where each of the plurality of electronic elements constituting the element-group formation substrate has a longer side and a shorter side, and arranged on the substrate in a state of aligning the longer side and the shorter side, the longer side is assumed to be the same direction and the shorter side is assumed to be the different direction.

15. A laser processing method in which a modified region group constituted by three or more modified regions including a modified region in a first direction being along a surface of a plate-shaped substrate and other modified region in a second direction being along the surface of the substrate and different from the first direction is formed inside the substrate by irradiating an element-group formation substrate, in which a plurality of electronic elements are formed on a front surface of the substrate, with laser light from a back surface side of the substrate, the method comprising:

forming the modified region and the other modified region constituting the modified region group with different depths from the back surface of the substrate.

16. The laser processing method according to claim 15, wherein the modified region and the other modified region constituting the modified region group are formed on a side closer to the back surface than a center of a thickness direction from the front surface to the back surface of the substrate.

17. The laser processing method according to claim 15, wherein the first direction is along a first arrangement direction of the plurality of electronic elements on the element-group formation substrate, and the second direction is along a second arrangement direction of the plurality of electronic elements on the element-group formation substrate.

18. The laser processing method according to claim 15, wherein the substrate is composed of sapphire and the plurality of electronic elements include a group III nitride semiconductor layer.

19. The laser processing method according to claim 15, wherein the modified region and the other modified region constituting the modified region group are formed sequentially so that the first direction and the second direction alternately appear.

* * * * *